United States Patent
Watanabe et al.

(10) Patent No.: US 8,982,920 B2
(45) Date of Patent: Mar. 17, 2015

(54) SUBMOUNT, SUBMOUNT ASSEMBLY, AND SUBMOUNT ASSEMBLING METHOD

(75) Inventors: Hideki Watanabe, Kanagawa (JP); Rintaro Koda, Tokyo (JP); Masaru Kuramoto, Kanagawa (JP); Kaori Naganuma, Kanagawa (JP); Hiroyuki Yokoyama, Miyagi (JP)

(73) Assignees: Sony Corporation, Tokyo (JP); Tohoku University, Miyagi (JP)

( * ) Notice: Subject to any disclaimer, the term of this patent is extended or adjusted under 35 U.S.C. 154(b) by 34 days.

(21) Appl. No.: 13/364,957

(22) Filed: Feb. 2, 2012

(65) Prior Publication Data

US 2012/0201259 A1    Aug. 9, 2012

(30) Foreign Application Priority Data

Feb. 4, 2011    (JP) ................................ 2011-022540

(51) Int. Cl.
  *H01S 5/00*    (2006.01)
  *H01S 5/22*    (2006.01)
  (Continued)

(52) U.S. Cl.
  CPC . *H01S 5/22* (2013.01); *B82Y 20/00* (2013.01); *H01S 5/02268* (2013.01); *H01S 5/02272* (2013.01); *H01S 5/0265* (2013.01);
  (Continued)

(58) Field of Classification Search
  CPC .............................. H01S 5/02268; B82Y 20/00
  USPC ............................................... 372/107, 36, 34
  See application file for complete search history.

(56) References Cited

U.S. PATENT DOCUMENTS

| | | | | |
|---|---|---|---|---|
| 6,091,755 A | * | 7/2000 | Sanders et al. | 372/92 |
| 2002/0006151 A1 | * | 1/2002 | Yamauchi | 372/109 |
| 2005/0051841 A1 | * | 3/2005 | Leedy | 257/347 |

FOREIGN PATENT DOCUMENTS

| | | |
|---|---|---|
| JP | 57-007989 | 1/1982 |
| JP | 59-110185 | 6/1984 |

(Continued)

OTHER PUBLICATIONS

Japanese Office Action issued Jul. 8, 2014 in corresponding Japanese Patent Application No. 2011022540.

*Primary Examiner* — Tuan Nguyen
(74) *Attorney, Agent, or Firm* — K&L Gates LLP

(57) ABSTRACT

A submount having a structure and a configuration resistant to an increase in manufacturing cost and a reduction in yields or reliability, and including an oblique waveguide is provided. A submount having a first surface and allowing a semiconductor light-emitting element including a waveguide to be fixed on the first surface, the waveguide having an axis line inclined at $\theta_{WG}$ (degrees) with respect to a normal to a light-incident/emission end surface of the semiconductor light-emitting element, and made of a semiconductor material with a refractive index $n_{LE}$, the submount includes: a fusion-bonding material layer on the first surface; and an alignment mark formed in the fusion-bonding material layer, the alignment mark allowed to be recognized at an angle $\theta_{SM} = \sin^{-1}[n_{LE} \cdot \sin(\theta_{WG})/n_0]$, where a refractive index of a light-transmitting medium in proximity to the outside of the light-incident/emission end surface of the semiconductor light-emitting element is $n_0$.

12 Claims, 27 Drawing Sheets

(51) Int. Cl.
  *B82Y 20/00* (2011.01)
  *H01S 5/022* (2006.01)
  *H01S 5/026* (2006.01)
  *H01S 5/028* (2006.01)
  *H01S 5/042* (2006.01)
  *H01S 5/065* (2006.01)
  *H01S 5/14* (2006.01)
  *H01S 5/34* (2006.01)
  *H01S 5/343* (2006.01)
  *H01S 5/40* (2006.01)
  *H01S 5/50* (2006.01)

(52) U.S. Cl.
  CPC ............ *H01S 5/0287* (2013.01); *H01S 5/0425* (2013.01); *H01S 5/0657* (2013.01); *H01S 5/141* (2013.01); *H01S 5/342* (2013.01); *H01S 5/34333* (2013.01); *H01S 5/4006* (2013.01); *H01S 5/50* (2013.01); *H01S 2301/176* (2013.01)
  USPC ...................................... 372/44.01

(56)     References Cited

FOREIGN PATENT DOCUMENTS

| JP | 60-176355 | | 9/1985 | |
| --- | --- | --- | --- | --- |
| JP | 11087840 | * | 3/1999 | ............... H01S 5/00 |
| JP | H11-087840 | | 3/1999 | |
| JP | 2003-017794 | | 1/2003 | |
| JP | 2006-269846 | | 10/2006 | |
| JP | 2007-088320 | * | 4/2007 | ............. H01L 33/30 |
| JP | 2007088320 | | 4/2007 | |
| JP | 2010-087209 | | 4/2010 | |

* cited by examiner

SUBMOUNT, SUBMOUNT ASSEMBLY, AND SUBMOUNT ASSEMBLING METHOD

CROSS REFERENCES TO RELATED APPLICATIONS

The present application claims priority to Japanese Priority Patent Application JP 2011-022540 filed in the Japan Patent Office on Feb. 4, 2011, the entire content of which is hereby incorporated by reference.

BACKGROUND

The present technology relates to a submount used to assemble a semiconductor light-emitting element, a submount assembly using the submount, and a submount assembling method.

Recently, for researches in a leading-edge science region using laser light of pulse duration in the attosecond range or the femtosecond range, ultrashort-pulse/ultrahigh-power lasers have been frequently used. Moreover, in addition to scientific interest in an ultrafast phenomenon on a timescale of picoseconds or femtoseconds, applied research in ultrashort pulse lasers with use of high peak power for practical use such as microfabrication or two-photon imaging has been actively conducted. Further, a high-power/ultrashort-pulse laser diode element with a light emission wavelength of 405 nm made of a GaN-based compound semiconductor is expected to serve as a light source of a volumetric optical disk system which is expected as a next-generation optical disk system following a Blu-ray optical disk system, a light source necessary in the medical field, the bio-imaging field, or the like, or a coherent light source covering an entire visible light range.

As the ultrashort-pulse/ultrahigh-power laser, for example, a titanium/sapphire laser is known; however, the titanium/sapphire laser is an expensive and large solid laser light source, which is a main impediment to the spread of the technology. If the ultrashort-pulse/ultrahigh-power laser is realized through the use of a laser diode or a laser diode element, it is considered that a large reduction in size, price, and power consumption of the ultrashort-pulse/ultrahigh-power laser, and high stability of the ultrashort-pulse/ultrahigh-power laser will be achieved, thereby leading to a breakthrough in promoting widespread use of the ultrashort-pulse/ultrahigh-power laser in these fields.

A laser diode device assembly with an all-semiconductor structure as such a 405-nm-wavelength high-peak-power picosecond-pulse light source typically has an MOPA (Master Oscillator and Power Amplifier) configuration. More specifically, the laser diode device assembly is configured of a laser diode generating a picosecond pulse, and a semiconductor optical amplifier (SOA, semiconductor laser amplifier) amplifying the generated picosecond pulse. Herein, the optical amplifier directly amplifies an optical signal itself without converting the optical signal into an electrical signal, and has a laser structure without a resonator, and amplifies incident light by an optical gain of the amplifier. More specifically, one of pulse light sources with the MOPA configuration generating a picosecond pulse is a mode-locked laser diode device assembly including an external resonator.

The semiconductor optical amplifier is achievable by reducing reflectivity of both end surfaces of a laser diode element. To reduce reflectivity, a technique of applying nonreflective coatings configured of a dielectric multilayer film to the end surfaces is typically performed; however, even though the nonreflective coatings are applied to the end surfaces of the laser diode element including a waveguide perpendicular to the end surfaces, residual reflectivity is still high, and it is difficult to achieve a semiconductor optical amplifier having a sufficient optical gain. Therefore, a technique of reducing effective reflectivity is used in a semiconductor optical amplifier including a waveguide arranged to be inclined with respect to the end surfaces, i.e., an oblique waveguide. Moreover, in the case where it is desired to reduce the reflectivity of the end surfaces of the laser diode element as in the case of a mode-locked laser diode element assembly configured with use of an external mirror, it is also effective to adopt a technique of arranging the waveguide to be inclined with respect to the end surfaces, that is, to adopt a laser diode element including an oblique waveguide.

In the case where the laser diode element or the semiconductor optical amplifier (hereinafter collectively referred to as "semiconductor light-emitting element") is actually used, it is necessary to efficiently optically couple the semiconductor light-emitting element to a lens, an optical device, an optical element, or another device. However, as described above, when the semiconductor light-emitting element with the waveguide inclined with respect to the end surfaces of the semiconductor light-emitting element is mounted to allow an axis line thereof to be parallel to an optical axis of a system, by Snell's law, light emitted from the semiconductor light-emitting element is inclined at a certain angle with respect to the optical axis of the system. Therefore, there is an issue that a system in related art is not allowed to be used without change. Moreover, in the semiconductor optical amplifier, there is an issue that optical coupling efficiency of incident light declines.

Therefore, as a method of solving such issues, Japanese Unexamined Patent Application Publication No. 2007-088320 discloses a technique of inclining a mount section of a heat sink, and Japanese Unexamined Patent Application Publication No. H11-087840 discloses a technique of forming markers 17 and 18 on a p-side contact layer of a laser diode element.

SUMMARY

In the technique disclosed in Japanese Unexamined Patent Application Publication No. 2007-088320, when the design of a laser diode element is changed, it is necessary to change the shape of a heat sink. Typically, the heat sink is formed with use of a die. Therefore, it is necessary to form a die each time the design is changed, and manufacturing cost of the semiconductor light-emitting element is increased. Moreover, in the technique disclosed in Japanese Unexamined Patent Application Publication No. H11-087840, a process time is increased by forming the markers 17 and 18, and an issue such as a reduction in yields or reliability caused by the formation of the markers 17 and 18 may arise.

Therefore, it is desirable to provide a submount which has a structure and a configuration resistant to issues including an increase in manufacturing cost of a semiconductor light-emitting element including an oblique waveguide and a reduction in yields or reliability, and is used to assemble the semiconductor light-emitting element, a submount assembly using the submount, and a submount assembling method.

According to an embodiment of the technology, there is provided a submount having a first surface and allowing a semiconductor light-emitting element including a waveguide to be fixed on the first surface, the waveguide having an axis line inclined at $\theta_{WG}$ (degrees) with respect to a normal to a light-incident/emission end surface of the semiconductor light-emitting element, and made of a semiconductor material with a refractive index $n_{LE}$, the submount including:

a fusion-bonding material layer on the first surface; and an alignment mark formed in the fusion-bonding material layer, the alignment mark allowed to be recognized at an angle $\theta_{SM}=\sin^{-1}[n_{LE}\cdot\sin(\theta_{WG})/n_0]$, where a refractive index of a light-transmitting medium in proximity to the outside of the light-incident/emission end surface of the semiconductor light-emitting element is $n_0$.

According to a first embodiment of the invention, there is provided a submount assembly including:

a semiconductor light-emitting element including a waveguide, the waveguide having an axis line inclined at $\theta_{WG}$ (degrees) with respect to a normal to a light-incident/emission end surface of the semiconductor light-emitting element, and made of a semiconductor material with a refractive index $n_{LE}$; and a submount allowing the semiconductor light-emitting element to be fixed on a first surface thereof, in which the submount includes:

a fusion-bonding material layer on the first surface; and an alignment mark formed in the fusion-bonding material layer, the alignment mark allowed to be recognized at an angle $\theta_{SM}=\sin^{-1}[n_{LE}\cdot\sin(\theta_{WG})/n_0]$, where a refractive index of a light-transmitting medium in proximity to the outside of the light-incident/emission end surface of the semiconductor light-emitting element is $n_0$.

According to a second embodiment of the technology, there is provided a submount assembly including:

a submount having a first surface and allowing a semiconductor light-emitting element including a waveguide to be fixed on the first surface, the waveguide having an axis line inclined at $\theta_{WG}$ (degrees) with respect to a normal to a light-incident/emission end surface of the semiconductor light-emitting element, and made of a semiconductor material with a refractive index $n_{LE}$; and a heat sink allowing the submount to be mounted thereon, in which the submount includes:

a fusion-bonding material layer on the first surface of the submount;

an adhesive layer formed on a second surface facing the first surface of the submount; and an alignment mark formed in the fusion-bonding material layer, the alignment mark allowed to be recognized at an angle $\theta_{SM}=\sin^{-1}[n_{LE}\cdot\sin(\theta_{WG})/n_0]$, where a refractive index of a light-transmitting medium in proximity to the outside of the light-incident/emission end surface of the semiconductor light-emitting element is $n_0$, and the submount is mounted on the heat sink with the adhesive layer in between.

According to a first embodiment of the technology, there is provided a submount assembling method, being a method of assembling a submount assembly, the submount assembly including:

a semiconductor light-emitting element including a waveguide, the waveguide having an axis line inclined at $\theta_{WG}$ (degrees) with respect to a normal to a light-incident/emission end surface of the semiconductor light-emitting element, and made of a semiconductor material with a refractive index $n_{LE}$; and a submount allowing the semiconductor light-emitting element to be fixed on a first surface thereof, the submount including;

a fusion-bonding material layer on the first surface; and an alignment mark formed in the fusion-bonding material layer, the alignment mark allowed to be recognized at an angle $\theta_{SM}=\sin^{-1}[n_{LE}\cdot\sin(\theta_{WG})/n_0]$, where a refractive index of a light-transmitting medium in proximity to the outside of the light-incident/emission end surface of the semiconductor light-emitting element is $n_0$, the method including:

aligning the submount and the semiconductor light-emitting element with respect to the alignment mark, and fusing and cooling the fusion-bonding material layer to mount the semiconductor light-emitting element on the submount.

According to a second embodiment of the technology, there is provided a submount assembling method, being a method of assembling a submount assembly, the submount assembly including:

a submount having a first surface and allowing a semiconductor light-emitting element including a waveguide to be fixed on the first surface, the waveguide having an axis line inclined at $\theta_{WG}$ (degrees) with respect to a normal to a light-incident/emission end surface of the semiconductor light-emitting element, and made of a semiconductor material with a refractive index $n_{LE}$; and a heat sink allowing the submount to be mounted thereon, the submount including:

a fusion-bonding material layer on the first surface;

an adhesive layer formed on a second surface facing the first surface of the submount; and an alignment mark formed in the fusion-bonding material layer, the alignment mark allowed to be recognized at an angle $\theta_{SM}=\sin^{-1}[n_{LE}\cdot\sin(\theta_{WG})/n_0]$, where a refractive index of a light-transmitting medium in proximity to the outside of the light-incident/emission end surface of the semiconductor light-emitting element is $n_0$, the submount being mounted on the heat sink with the adhesive layer in between, the method including:

aligning the submount and the heat sink with respect to the alignment mark, and fusing and cooling the adhesive layer to mount the submount on the heat sink.

The submount assembling methods according to the first and second embodiments of the technology may be combined, and in this case, the submount assembling method according to the first embodiment of the technology and the submount assembling method according to the second embodiment of the technology may be performed in this order, or the submount assembling method according to the second embodiment of the technology and the submount assembling method according to the first embodiment of the technology may be performed in this order. Alternatively, the submount assembling methods according to the first and second embodiments of the technology may be performed concurrently.

In the submount according to the embodiment of the technology, the submount assemblies according to the first and second embodiments of the technology, and the methods of assembling a submount assembly according to the first and second embodiments of the technology, the alignment mark allowed to be recognized at an angle $\theta_{SM}=\sin^{-1}[n_{LE}\cdot\sin(\theta_{WG})/n_0]$ is formed in the fusion-bonding material layer. Therefore, in the semiconductor light-emitting element including an oblique waveguide, issues such as an increase in assembling cost and a reduction in yields and reliability are less likely to occur. Moreover, the semiconductor light-emitting element including the oblique waveguide is allowed to be easily assembled in a system in related art, and optical coupling efficiency of the semiconductor light-emitting element is allowed to be improved, thereby improving performance of an entire system. Further, it is not necessary to drastically change an existing process of forming the semiconductor light-emitting element or the submount, and mounting is allowed to be performed with use of an image recognition apparatus; therefore, manufacturing cost and running cost are allowed to be significantly reduced.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Figure 1A:
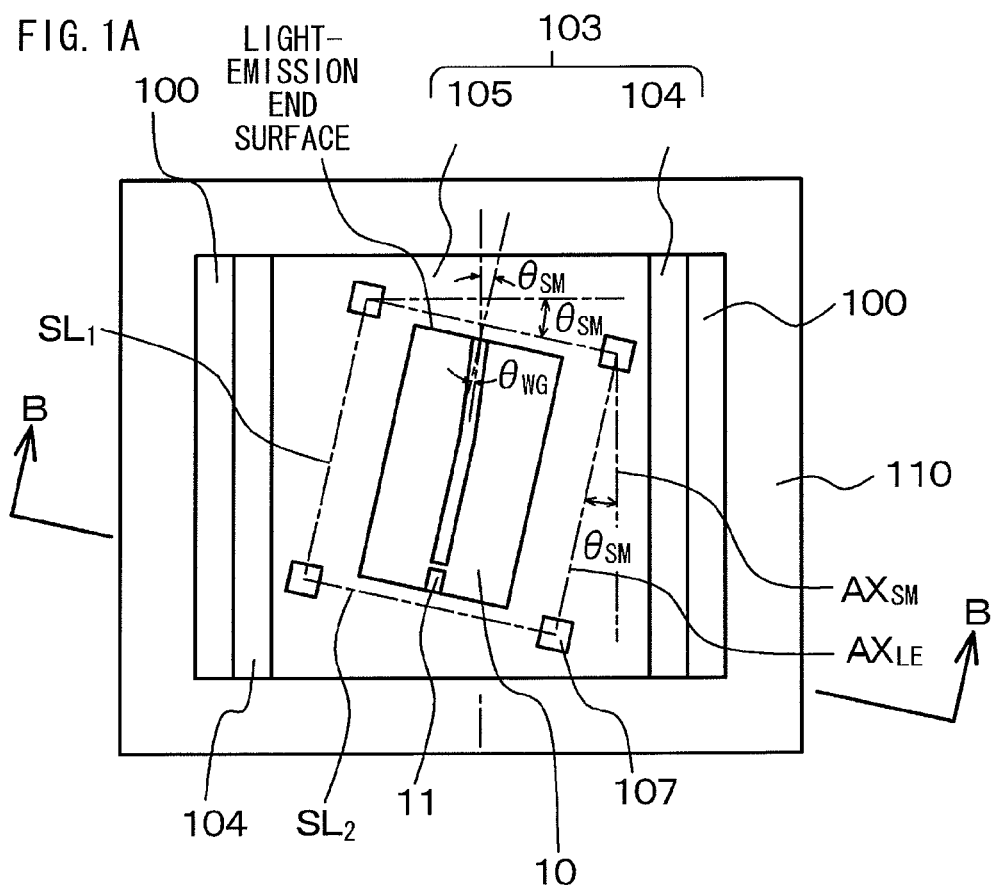
FIGS. 1A and 1B are a schematic plan view and a schematic end view of a submount assembly of Example 1, respectively.

The present technology will be described referring to examples and the accompanying drawings; however, the technology is not limited thereto, and various values and materials in the examples are given by way of illustration. It is to be noted that description will be given in the following order.

1. Submount according to an embodiment of the present technology, submount assemblies according to first and second embodiments of the technology, submount assembling methods according to first and second embodiments of the technology, and general description
2. Example 1 (Submount according to the embodiment of the technology, submount assembly according to the first embodiment of the technology, and submount assembling method according to the first embodiment of the technology)
3. Example 2 (Modification of Example 1)
4. Example 3 (Modification of Example 2)
5. Example 4 (Submount of the technology, submount assembly according to the second embodiment of the technology, submount assembling method according to the second embodiment of the technology), and others The submount assembly according to the first embodiment of the technology may further include a heat sink allowing a submount to be mounted thereon.

In the submount according to the embodiment of the technology, the submount assembly according to the first and second embodiments of the technology including the above-described preferred mode, and the submount assembling methods according to the first and second embodiments of the technology, a semiconductor light-emitting element may be configured of a laser diode element, or a semiconductor optical amplifier (SOA, semiconductor laser amplifier).

In the submount according to the embodiment of the technology, the submount assembly according to the first and second embodiments of the technology, and the submount assembling methods according to the first and second embodiments of the technology, including the above-described preferred modes and configurations, when the semiconductor light-emitting element is mounted on the submount, an axis line of the submount and an axis line of the semiconductor light-emitting element may intersect with each other at $\theta_{SM}$ (degrees). Then, in such a configuration, a fusion-bonding material layer may be provided with two or more point-like alignment marks, and a straight line connecting two of the alignment marks may intersect with the axis line of the submount at $\theta_{SM}$ (degrees) or (90-$\theta_{SM}$) (degrees), or the fusion-bonding material layer may be provided with one or more strip-like alignment marks, and an axis line of the alignment mark may intersect with the axis line of the submount at $\theta_{SM}$ (degrees) or (90-$\theta_{SM}$) (degrees).

Alternatively, in the submount according to the embodiment of the technology, the submount assembly according to the first and second embodiments of the technology, and the submount assembling method according to the first and second embodiments of the technology, including the above-described preferred modes and configurations, an adhesive layer may be formed on a second surface facing a first surface, and the submount may be mounted on the heat sink with the adhesive layer in between, and when the submount is mounted on the heat sink, the axis line of the submount and an axis line of the heat sink may intersect with each other at $\theta_{SM}$ (degrees). In such a configuration, the fusion-bonding material layer may be provided with two or more point-like alignment marks, and a straight line connecting two of the alignment marks may intersect with the axis line of the submount at $\theta_{SM}$ (degrees) or (90-$\theta_{SM}$) (degrees), or the fusion-bonding material layer may be provided with one or more strip-like alignment marks, and the axis line of the alignment mark may intersect with the axis line of the submount at $\theta_{SM}$ (degrees) or (90-$\theta_{SM}$) (degrees).

In the case where the fusion-bonding material layer is provided with two point-like alignment marks, two alignment marks may be arranged to allow a straight line connecting the two alignment marks to intersect with the axis line of the submount at $\theta_{SM}$ (degrees), or to intersect with the axis line of the submount at (90-$\theta_{SM}$) (degrees). Moreover, in the case where the fusion-bonding material layer is provided with three point-like alignment marks, the three alignment marks may be arranged to allow a straight line connecting a first alignment mark and a second alignment mark and a straight line connecting the second alignment mark and a third alignment mark to intersect with the axis line of the submount at $\theta_{SM}$ (degrees) and (90-$\theta_{SM}$) (degrees), respectively. Further, in the case where the fusion-bonding material layer is provided with four point-like alignment marks, the four point-like alignment marks may be arranged to allow a straight line connecting a first alignment mark and a second alignment mark and a straight line connecting a third alignment mark and a fourth alignment mark to intersect with the axis line of the submount at $\theta_{SM}$ (degrees), and to allow a straight line connecting the first alignment mark and the fourth alignment mark and a straight line connecting the second alignment mark and the third alignment mark to intersect with the axis line of the submount at (90-$\theta_{SM}$) (degrees).

In the case where the fusion-bonding material layer is provided with one strip-like alignment mark, the one strip-like alignment mark may be arranged to allow the axis line thereof to intersect with the axis line of the submount at $\theta_{SM}$ (degrees), or to intersect with the axis line of the submount at (90-$\theta_{SM}$) (degrees). In the case where the fusion-bonding material layer is provided with two strip-like alignment marks, the two strip-like alignment marks may be arranged to allow the axis lines thereof to intersect with the axis line of the submount at $\theta_{SM}$ (degrees), or to allow the axis lines thereof to intersect with the axis line of the submount at (90-$\theta_{SM}$) (degrees), or to allow the axis line of one of the strip-like alignment marks and the axis line of the other strip-like alignment mark to intersect with the axis line of the submount at $\theta_{SM}$ (degrees) and (90-$\theta_{SM}$) (degrees), respectively. In the case where the fusion-bonding material layer is provided with three strip-like alignment marks, the three strip-like alignment marks may be arranged to allow the axis lines of two of the three strip-like alignment marks and the axis line of the remaining strip-like alignment mark to intersect with the axis line of the submount at $\theta_{SM}$ (degrees) and (90-$\theta_{SM}$) (degrees), respectively, or to intersect with the axis line of the submount at (90-$\theta_{SM}$) (degrees) and $\theta_{SM}$ (degrees), respectively. In the case where the fusion-bonding material layer is provided with four strip-like alignment marks, the four strip-like alignment marks may be arranged to allow axis lines of a first strip-like alignment mark and a third strip-like alignment mark and axis lines of a second strip-like alignment mark and a fourth strip-like alignment mark to intersect with the axis line of the submount at $\theta_{SM}$ (degrees) and (90-$\theta_{SM}$) (degrees), respectively.

In the submount according to the embodiment of the technology, the submount assembly according to the first and second embodiments of the technology, and the submount assembling method according to the first and second embodiment of the technology, including the above-described various preferred modes and configurations, the fusion-bonding material layer may have a laminate structure including an Au layer and an Au—Sn alloy layer (for example, $Au_{80}Sn_{20}$ alloy layer) in order from the first surface side, and the alignment mark may be configured of an opening formed in the Au—Sn alloy layer, and the Au layer may be exposed at a bottom of the opening. In such a configuration, the alignment mark is easily detectable by an image recognition apparatus. However, the structure of the fusion-bonding material layer is not limited thereto, and the fusion-bonding material layer may have a laminate structure including an Au layer and an Ag—Sn alloy layer in order from the first surface side. In the fusion-bonding material layer with such a two-layer structure, a projection image of the Au—Sn alloy layer is preferably included in a projection image of the Au layer, thereby allowing, for example, a wiring line or the like to be connected to the Au layer by a bonding process. However, the fusion-bonding material layer is not limited to such a material configuration and a layer structure. As a material forming the fusion-bonding material layer or a material forming the adhesive layer, a so-called low-melting-point metal (alloy) material, a soldering material, or a brazing material may be used, and examples of the material include In (indium with a melting point of 157° C.); an indium-gold-based low-melting-point alloy; tin (Sn)-based high-temperature solder such as $Sn_{80}Ag_{20}$ (with a melting point of 220° C. to 370° C.) and $Sn_{95}Cu_5$ (with a melting point of 227° C. to 370° C.); lead (Pb)-based high-temperature solder such as $Pb_{97.5}Ag_{2.5}$ (with a melting point of 304° C.), $Pb_{94.5}Ag_{2.5}$ (with a melting point of 304° C. to 365° C.), and $Pb_{97.5}Ag_{1.35}Sn_{1.0}$ (with a melting point of 309° C.); zinc (Zn)-based high-temperature soldering such as $Zn_{95}Al_5$ (with a melting point of 380° C.); tin-lead-based standard solder such as $Sn_5Pb_{95}$ (with a melting point of 300° C. to 314° C.) and $Sn_2Pb_{98}$ (with a melting point of 316° C. to 322° C.); a brazing material such as $Au_{88}Ga_{12}$ (with a melting point of 381° C.) (all the subscripts are in at %). It is to be noted that in the case where the semiconductor light-emitting element and the submount are heated to be bonded together, and the heat sink and the submount are heated to be bonded together, it is necessary for the melting point of a material forming the adhesive layer or the fusion-bonding material layer which is to be heated in a later process to be lower than that of the material forming the fusion-bonding material layer or the adhesive layer which is to be heated in an earlier process. In the case where the semiconductor light-emitting element and the submount, and the heat sink and the submount are heated at the same time to be bonded together, as the materials forming the fusion-bonding material layer and the adhesive layer, the same material is allowed to be used. The fusion-bonding material layer and the adhesive layer are allowed to be formed by a PVD method such as a vacuum deposition method or a sputtering method, and the alignment mark is allowed to be formed by, for example, an etching method or a liftoff method.

Examples of a material forming the submount include AlN, diamond, Si, and SiC, and examples of a material forming the heat sink include copper, copper-tungsten, a copper alloy, iron, stainless steel, aluminum, an aluminum alloy, tungsten, molybdenum, copper-molybdenum, and aluminum-silicon carbide. The submount and the heat sink may be formed by a known method.

Moreover, in the submount according to the embodiment of the technology, the submount assembly according to the first and second embodiments of the technology, and the submount assembling method according to the first and second embodiments of the technology, including the above-described various preferred modes and configurations, the alignment mark may overlap the semiconductor light-emitting element, or the alignment mark may not overlap the semiconductor light-emitting element. In the former case, the semiconductor light-emitting element may be made of a material (for example, a GaN-based compound semiconductor) allowing the alignment mark to be recognized from above through the semiconductor light-emitting element, or a component disposed above the alignment mark of the semiconductor light-emitting element may be made of a transparent material.

To mount the semiconductor light-emitting element on the submount, a second electrode which will be described later may be mounted on the submount, or a first electrode which will be described later may be mounted on the submount. In the former case, a compound semiconductor layer and a substrate are laminated in this order on the submount; therefore, the semiconductor light-emitting element is mounted in a so-called junction-down manner. On the other hand, in the latter case, the substrate and the compound semiconductor layer are laminated in this order on the submount; therefore, the semiconductor light-emitting element is mounted in a so-called junction-up manner.

Further, in the submount according to the embodiment of the technology, the submount assembly according to the first and second embodiments of the technology, and the submount assembling method according to the first and second embodiments of the technology, including the above-described various preferred modes and configurations, a light-incident/emission end surface of the semiconductor light-emitting element may be projected from the submount, thereby allowing the semiconductor light-emitting element to be mounted in a so-called junction-down manner, and allowing an effect of cooling the semiconductor light-emitting element by the heat sink to be further improved.

An angle $\theta_{WG}$ may be within a range of $0.1° \leq \theta_{WG} \leq 10°$, preferably within a range of $2° \leq \theta_{WG} \leq 6°$. In the case where the semiconductor light-emitting element has a ridge stripe structure, the axis line of a waveguide corresponds to a straight line connecting midpoints of line segments connecting both side surfaces in a width direction of the ridge stripe structure or a combination of line segments. Moreover, the axis line is inclined at $\theta_{WG}$ (degrees) with respect to a normal to the light-incident/emission end surface; however, depending on the structure and configuration of the semiconductor light-emitting element, the axis line may be inclined at $\theta_{WG}$ (degrees) with respect to a normal to a light-incident end surface, a normal to a light-emission end surface, or a normal to two light-incident/emission end surfaces.

In the submount according to the embodiment of the technology, the submount assembly according to the first and second embodiments of the technology, and the submount assembling method according to the first and second embodiments of the technology, including the above-described various preferred modes and configurations (hereinafter collectively and simply referred to as "the technology"), in the case where the semiconductor light-emitting element is configured of a laser diode element, the laser diode element may be a known continuous-wave laser diode element, or a pulse laser diode element. In the latter case, examples of a laser diode element constituting a mode-locked laser diode element include a laser diode element provided with a light emission region and a saturable absorption region, and more specifically, the laser diode element is allowed to be classified, by an arrangement state of the light emission region and the saturable absorption region, into a SAL (Saturable Absorber Layer) type and a WI (Weakly Index guide) type in which the light emission region and the saturable absorption region are arranged in a vertical direction, and a multi-section type in which the light emission region and the saturable absorption region are apposed in a resonator (waveguide) direction.

Herein, as a mode of the multi-section type laser diode element, a bisection type laser diode element may include:

(a) a laminate structure body configured by laminating, in order, a first compound semiconductor layer of a first conductivity type made of a GaN-based compound semiconductor, a third compound semiconductor layer (active layer) made of a GaN-based compound semiconductor and having a light emission region and a saturable absorption region, and a second compound semiconductor layer of a second conductivity type made of a GaN-based compound semiconductor, the second conductivity type being different from the first conductivity type;

(b) a second electrode formed on the second compound semiconductor layer; and (c) a first electrode electrically connected to the first compound semiconductor layer, in which the second electrode is separated by a separation groove into a first section and a second section, the first section configured to create a forward bias state by passing a current to the first electrode through the light emission region, the second section configured to apply an electric field to the saturable absorption region. It is to be noted that, for the sake of convenience, the laser diode element with such a configuration may be referred to as "laser diode element in the technology".

Then, it is desirable that electrical resistance between the first section and the second section of the second electrode be 1×10 times or more, preferably 1×10² times or more, more preferably 1×10³ times or more as high as electrical resistance between the second electrode and the first electrode. It is to be noted that, for the sake of convenience, such a laser diode element in the technology is referred to as "laser diode element with a first configuration". Alternatively, it is desirable that electrical resistance between the first section and the second section of the second electrode be 1×10²Ω or more, preferably 1×10³Ω or more, more preferably 1×10⁴Ω or more. It is to be noted that, for the sake of convenience, such a laser diode element in the technology is referred to as "laser diode element with a second configuration".

In the laser diode element with the first configuration or the second configuration, the electrical resistance between the first section and the second section of the second electrode is 10 times or more as high as electrical resistance between the second electrode and the first electrode, or 1×10²Ω or more. Therefore, a leakage current flowing from the first section of the second electrode to the second section thereof is allowed to be reliably suppressed. In other words, while a current injected into the light emission region (a carrier injection region, a gain region) is allowed to be increased, a reverse bias voltage $V_{sa}$ applied to the saturable absorption region (carrier non-injection region) is allowed to be increased; therefore, a mode-locking operation in a single mode having laser light of short pulse duration is achievable. Then, such high electrical resistance between the first section and the second section of the second electrode is achievable only by separating the second electrode into the first section and the second section by the separation groove.

In the laser diode element with the first configuration or the second configuration, a forward bias state is created by passing a current from the first section of the second electrode to the first electrode through the light emission region, and a voltage is applied between the first electrode and the second section of the second electrode to apply an electric field to the saturable absorption region, thereby allowing the mode-locking operation to be performed. Moreover, a configuration in which a reverse bias voltage is applied between the first electrode and the second section (that is, a configuration in which the first electrode and the second section are a cathode and an anode, respectively) is desirable. It is to be noted that a pulse current applied to the first section of the second electrode, a pulse current in synchronization with a pulse voltage, or a pulse voltage may be applied to the second section of the second electrode, or a DC bias may be applied to the second section of the second electrode. Moreover, while a current is passed from the second electrode to the first electrode through the light emission region, an external electrical signal may be applied from the second electrode to the first electrode through the light emission region to be superimposed on the current. Accordingly, an optical pulse and an external electrical signal are allowed to be synchronized. Alternatively, an optical signal is allowed to enter from a light-incident end surface of the laminate structure body. Thus, the optical pulse and the optical signal are allowed to be synchronized.

Moreover, in the laser diode element in the technology, the third compound semiconductor may have, but not limited to, a quantum well structure including a well layer and a barrier layer, and the thickness of the well layer is within a range of 1 nm to 10 nm both inclusive, preferably within a range of 1 nm to 8 nm both inclusive, and the doping concentration of an impurity in the barrier layer is within a range of $2\times10^{18}$ cm$^{-3}$ to $1\times10^{20}$ cm$^{-3}$ both inclusive, preferably within a range of $1\times10^{19}$ cm$^{-3}$ to $1\times10^{20}$ cm$^{-3}$ both inclusive. It is to be noted that, for the sake of convenience, such a laser diode element in the technology may be referred to as "laser diode element with a third configuration".

When the thickness of the well layer constituting the third compound semiconductor layer is determined within a range of 1 nm to 10 nm both inclusive, and the doping concentration of the impurity in the barrier layer constituting the third compound semiconductor layer is determined within a range of $2\times10^{18}$ cm$^{-3}$ to $1\times10^{20}$ cm$^{-3}$ both inclusive, i.e., when the thickness of the well layer is reduced, and carriers of the third compound semiconductor layer are increased, the effect of piezopolarization is allowed to be reduced, and a laser light source capable of generating an unimodel optical pulse of short duration having a smaller number of sub-pulse components is allowed to be obtained. Moreover, a mode-locking drive is allowed to be achieved with a lowest possible reverse bias voltage, and an optical pulse train in synchronization with external signals (an electrical signal and an optical signal) is allowed to be generated. The impurity included in the barrier layer may be, but not limited to, silicon (Si), and the impurity may be oxygen (O).

The laser diode elements with the first to third configurations may be laser diode elements having a ridge stripe type separate confinement heterostructure (SCH structure).

Further, in the laser diode element in the technology, it is desirable that the width of the second electrode be within a range of 0.5 μm to 50 μm both inclusive, preferably within a range of 1 μm to 5 μm both inclusive, the height of the ridge stripe structure be within a range of 0.1 μm to 10 μm both inclusive, preferably within a range of 0.2 μm to 1 μm both inclusive, and the width of the separation groove separating the second electrode into the first section and the second section be within a range of 1 μm or more and 50% or less of the length of a resonator, preferably 10 μm or more and 10% or less of the length of the resonator. A resonator length may be 0.6 mm as an example, but is not limited thereto. Moreover, the width of the ridge stripe structure may be 2 μm or less as an example, and the lower limit of the width of the ridge stripe structure may be 0.8 μm as an example, but they are not limited thereto. A distance (D) from a top surface of a section disposed outside of both side surfaces of the ridge stripe structure in the second compound semiconductor layer to the third compound semiconductor layer (active layer) is preferably $1.0\times10^{-7}$ m (0.1 μm) or more. When the distance (D) is determined in such a manner, the saturable absorption region is allowed to be reliably formed on both sides (referred to as "a Y direction") of the third compound semiconductor layer. The upper limit of the distance (D) may be determined based on a rise in threshold current, temperature characteristics, a reduction in a current rise rate in a long-term drive, and the like. It is to be noted that in the following description, a resonator length direction or a direction where a waveguide extends is defined as X direction, and a thickness direction of the laminate structure body is defined as Z direction.

Moreover, in the laser diode element in the technology including the above-described preferred modes, or in the semiconductor optical amplifier constituting the semiconductor light-emitting element in the technology (for the sake of convenience, hereinafter may be referred to as "semiconductor optical amplifier in the technology"), the second electrode may be configured of a palladium (Pd) single layer, a nickel (Ni) single layer, a platinum (Pt) single layer, a palladium layer/platinum layer laminate structure in which a platinum layer is in contact with the second compound semiconductor layer, or a palladium layer/nickel layer laminate structure in which a palladium layer is in contact with the second compound semiconductor layer. It is to be noted that in the case where a lower metal layer is made of palladium, and an upper metal layer is made of nickel, it is desirable that the thickness of the upper metal layer be 0.1 µm or more, preferably 0.2 µm or more. Alternatively, the second electrode is preferably configured of a palladium (Pd) single layer, and in this case, it is desirable that the thickness thereof be 20 nm or more, preferably 50 nm or more. Alternatively, the second electrode is preferably configured of a palladium (Pd) single layer, a nickel (Ni) single layer, a platinum (Pt) single layer, or a laminate structure including a lower metal layer, which is in contact with the second compound semiconductor layer, and an upper metal layer (where the lower metal layer is made of one kind of metal selected from the group consisting of palladium, nickel, and platinum, and the upper metal layer is made of a metal with an etching rate, in the case where the separation groove in the second electrode is formed in a step (D) which will be described later, being equal to, substantially equal to, or higher than the etching rate of the lower metal layer). Moreover, it is desirable that an etchant used to form the separation groove in the second electrode in the step (D) which will be described later be aqua regia, nitric acid, sulfuric acid, hydrochloric acid, or a mixed solution of two or more kinds selected from them (specifically, a mixed solution of nitric acid and sulfuric acid or a mixed solution of sulfuric acid and hydrochloric acid). It is desirable that the width of the second electrode be within a range of 0.5 µm to 50 µm both inclusive, preferably within a range of 1 µm to 5 µm both inclusive.

In the laser diode element in the technology including the above-described preferred configurations and modes, the length of the saturable absorption region may be shorter than that of the light emission region. Alternatively, the length of the second electrode (the total length of the first section and the second section) may be shorter than the length of the third compound semiconductor layer (active layer). Specific arrangement states of the first section and the second section of the second electrode include:

(1) a state where one first section of the second electrode and one second section of the second electrode are provided, and the first section of the second electrode and the second section of the second electrode are disposed with the separation groove in between;

(2) a state where one first section of the second electrode and two second sections of the second electrode are provided, and an end of the first section faces one of the second sections with one separation groove in between, and the other end of the first section faces the other second section with the other separation groove in between; and (3) a state where two first sections of the second electrode and one second section of the second electrode are provided, and an end of the second section faces one of the first sections with one separation groove in between, and the other end of the second section faces the other first section with the other separation groove in between (that is, the second electrode has a configuration in which the second section is sandwiched between the first sections). More broadly, the arrangement states include:

(4) a state where N first sections of the second electrode and (N−1) second sections of the second electrode are provided, and the first sections of the second electrode are arranged with the second sections of the second electrode sandwiched therebetween;

(5) a state where N second sections of the second electrode and (N−1) first sections of the second electrode are provided, and the second sections of the second electrode are arranged with the first sections of the second electrode sandwiched therebetween; and (6) a state where N second sections of the second electrode and N first sections of the second electrode are provided, and the second sections of the second electrode and the first sections of the second electrode are aligned.

It is to be noted that in other words, the states (4) and (5) are (4') a state where N light emission regions (carrier injection regions, gain regions) and (N−1) saturable absorption regions (carrier non-injection regions) are provided, and the light emission regions are arranged with the saturable absorption region sandwiched therebetween and (5') a state where N saturable absorption regions (carrier non-injection regions) and (N−1) of light emission regions (carrier injection regions, gain regions) are provided, and the saturable absorption regions are arranged with the light emission region sandwiched therebetween, respectively. It is to be noted that when configurations (3), (5), and (5') are adopted, damage is less likely to occur in the light-emission end surfaces of the laser diode elements with the first to third configurations.

The laser diode element in the technology is allowed to be manufactured by the following method. More specifically, the laser diode is allowed to be manufactured by a method including the following steps of:

(A) forming the laminate structure body configured by laminating, in order, the first compound semiconductor layer of a first conductivity type made of a GaN-based compound semiconductor, the third compound semiconductor layer made of a GaN-based compound semiconductor and having a light emission region and a saturable absorption region, and the second compound semiconductor layer of a second conductivity type made of a GaN-based compound semiconductor, the second conductivity type being different from the first conductivity type;

(B) forming the second electrode on the second compound semiconductor layer;

(C) forming the ridge stripe structure by etching a part or a whole of the second compound semiconductor layer with use of the second electrode as an etching mask; and (D) forming a resist layer for forming the separation groove in the second electrode, and then forming the separation groove in the second electrode by a wet-etching method with use of the resist layer as a wet-etching mask, thereby separating the second electrode into the first section and the second section by the separation groove.

Then, when such a manufacturing method is adopted, specifically, when the ridge stripe structure is formed by etching a part or a whole of the second compound semiconductor layer with use of the second electrode as an etching mask, i.e., by a self-alignment system with use of the patterned second electrode as an etching mask, misalignment between the second electrode and the ridge stripe structure does not occur. Moreover, the separation groove is preferably formed in the second electrode by a wet-etching method. Thus, when the wet-etching method is adopted, unlike a dry-etching method, deterioration in optical and electrical characteristics of the second compound semiconductor layer is allowed to be suppressed. Therefore, deterioration in light emission characteristics is allowed to be reliably prevented.

It is to be noted that, depending on the configuration and structure of the laser diode element to be manufactured, in the step (C), the second compound semiconductor layer may be partially etched in a thickness direction, or the second compound semiconductor layer may be entirely etched in the thickness direction, or the second compound semiconductor layer and the third compound semiconductor layer may be etched in the thickness direction, or the second compound semiconductor layer and the third compound semiconductor layer, and further the first compound semiconductor layer may be partially etched in the thickness direction.

Moreover, in the step (D), it is desirable to satisfy $ER_0/ER_1 \geq 1 \times 10$, preferably $ER_0/ER_1 \geq 1 \times 10^2$, where the etching rate of the second electrode and the etching rate of the laminate structure body in the case where the separation groove is formed in the second electrode are $ER_0$ and $ER_1$, respectively. When $ER_0/ER_1$ satisfies such a relationship, the second electrode is allowed to be reliably etched without etching the laminate structure body (or with only slightly etching the laminate structure body).

The semiconductor optical amplifier in the technology may be configured of a transmissive semiconductor optical amplifier, but is not limited thereto, and may be configured of a reflective semiconductor optical amplifier, a resonant semiconductor optical amplifier, or a monolithic semiconductor optical amplifier.

In this case, the transmissive semiconductor optical amplifier may include:

(a) a laminate structure body configured by laminating, in order, a first compound semiconductor layer of a first conductivity type made of a GaN-based compound semiconductor, a third compound semiconductor layer made of a GaN-based compound semiconductor and having an optical amplification region (a carrier injection region, a gain region), and a second compound semiconductor layer of a second conductivity type made of a GaN-based compound semiconductor, the second conductivity type being different from the first conductivity type;

(b) a second electrode formed on the second compound semiconductor layer; and (c) a first electrode electrically connected to the first compound semiconductor layer.

In such a semiconductor optical amplifier, the laminate structure body may have a ridge stripe structure. Moreover, a carrier non-injection region may be provided along an axis line of the semiconductor optical amplifier in a region from a light-emission end surface to the inside of the laminate structure body, and the length $L_{NC}$ of the carrier non-injection region along the axis line of the semiconductor optical amplifier (the width of the carrier non-injection region) may be within a range of 1 μm to 100 μm as an example. Further, the carrier non-injection region may be provided along the axis line of the semiconductor optical amplifier in a region from a light-incident end surface to the inside of the laminate structure body.

A low-reflective coating layer configured of a laminate structure including two or more layers selected from the group consisting of a titanium oxide layer, a tantalum oxide layer, a zirconia oxide layer, a silicon oxide layer, and an aluminum oxide layer may be formed on the light-incident end surface and the light-emission end surface of the semiconductor optical amplifier in the technology, or the light-emission end surface of the laser diode element in the technology.

Although it depends on modes, the semiconductor optical amplifier in the technology may substantially adopt the above-described various configurations of the laser diode element in the technology. Moreover, although it depends on modes, the semiconductor optical amplifier in the technology may be substantially manufactured by a manufacturing method similar to the above-described method of manufacturing the laser diode element in the technology, but the manufacturing method is not limited thereto.

In the semiconductor optical amplifier in the technology, the laser light source may be configured of the above-described laser diode element in the technology, and pulse laser light emitted from the laser diode element may enter the semiconductor optical amplifier, and in this case, the laser light source may emit pulse laser light according to the mode-locking operation. However, the laser light source is not limited thereto, and may be configured of a known continuous-wave laser diode light source, any of known pulse laser light sources of various systems and modes including a gain switching system and a loss switching system (a Q switching system), or a laser light source such as a titanium/sapphire laser. It is to be noted that the semiconductor optical amplifier in the technology directly amplifies an optical signal itself without converting the optical signal into an electrical signal, and has a laser structure with a minimized resonator effect, and amplifies incident light by an optical gain of the semiconductor optical amplifier. In other words, for example, as described above, the semiconductor optical amplifier in the technology may have a configuration and a structure substantially same as or different from those of the laser diode element in the technology.

In the semiconductor light-emitting element in the technology including the above-described preferred configurations and modes, specifically, the laminate structure body may be made of an AlGaInN-based compound semiconductor. Specific AlGaInN-based compound semiconductors include GaN, AlGaN, GaInN, and AlGaInN. Moreover, these compound semiconductors may include a boron (B) atom, a thallium (Tl) atom, an arsenic (As) atom, a phosphorus (P) atom, or an antimony (Sb) atom at request. Further, it is desirable that the third compound semiconductor layer (active layer) having the optical amplification region, or the light emission region (gain region) and the saturable absorption region have a quantum well structure. More specifically, the third compound semiconductor layer may have a single quantum well structure (QW structure) or a multiple quantum well structure (MQW structure). The third compound semiconductor layer (active layer) with a quantum well structure has a structure configured by laminating one or more well layers and one or more barrier layers; however, examples of a combination of (a compound semiconductor forming the well layer, a compound semiconductor forming the barrier layer) include $(In_yGa_{(1-y)}N, GaN)$, $(In_yGa_{(1-y)}N, In_zGa_{(1-z)}N)$ (where y>z), and $(In_yGa_{(1-y)}N, AlGaN)$.

Moreover, in the semiconductor light-emitting element in the technology including the above-described preferred configurations and modes, the second compound semiconductor layer may have a superlattice structure in which p-type GaN layers and p-type AlGaN layers are alternately laminated, and the thickness of the superlattice structure may be 0.7 μm or less. When such a superlattice structure is adopted, while a high refractive index necessary as a cladding layer is maintained, a series resistance component of the semiconductor light-emitting element is allowed to be reduced, thereby leading to a reduction in operation voltage of the semiconductor light-emitting element. It is to be noted that the lower limit of the thickness of the superlattice structure may be, but not limited to, for example, 0.3 μm, and the thickness of the p-type GaN layer constituting the superlattice structure may be within a range of 1 nm to 5 nm, and the thickness of the p-type AlGaN layer constituting the superlattice structure may be within a range of 1 nm to 5 nm, and the total layer number of the p-type GaN layers and the p-type AlGaN layers may be within a range of 60 layers to 300 layers. Further, a distance from the third compound semiconductor layer to the second electrode may be 1 μm or less, preferably 0.6 μm or less. When the distance from the third compound semiconductor layer to the second electrode is determined in such a manner, the thickness of a p-type second compound semiconductor layer with high resistance is allowed to be reduced to achieve a reduction in operation voltage of the semiconductor light-emitting element. It is to be noted that the lower limit of the distance from the third compound semiconductor layer to the second electrode may be, but not limited to, for example, 0.3 μm. Moreover, the second compound semiconductor layer is doped with $1 \times 10^{19}$ cm$^{-3}$ or more of Mg; and the absorption coefficient of the second compound semiconductor layer with respect to light with a wavelength of 405 nm from the third compound semiconductor layer is 50 cm$^{-1}$ or more. The atomic concentration of Mg is set on the basis of material physical properties in which the maximum hole concentration is exhibited at an atomic concentration of $2 \times 10^{19}$ cm$^{-3}$, and the atomic concentration of Mg is a result of design to achieve a maximum hole concentration, i.e., minimum resistivity of the second compound semiconductor layer. The absorption coefficient of the second compound semiconductor layer is determined to minimize the resistance of the semiconductor light-emitting element, and as a result, the absorption coefficient of light from the third compound semiconductor layer is typically 50 cm$^{-1}$. However, the doping amount of Mg may be intentionally set to a concentration of $2 \times 10^{19}$ cm$^{-3}$ or more to increase the absorption coefficient. In this case, the upper limit of the doping amount of Mg to achieve a practical hole concentration is, for example, $8 \times 10^{19}$ cm$^{-3}$. Further, the second compound semiconductor layer includes an undoped compound semiconductor layer and a p-type compound semiconductor layer in order from the third compound semiconductor layer side, and a distance from the third compound semiconductor layer to the p-type compound semiconductor layer may be $1.2 \times 10^{-7}$ m or less. When the distance from the third compound semiconductor layer to the p-type compound semiconductor layer is determined in such a manner, internal loss is allowed to be suppressed without decreasing internal quantum efficiency, thereby allowing a threshold current $I_{th}$ at which laser oscillation starts to be reduced. It is to be noted that the lower limit of the distance from the third compound semiconductor layer to the p-type compound semiconductor layer may be, but not limited to, for example, $5 \times 10^{-8}$ m. Moreover, a laminated insulating film configured of a SiO$_2$/Si laminate structure is formed on both side surfaces of the ridge stripe structure; and a difference in effective refractive index between the ridge stripe structure and the laminated insulating film may be within a range of $5 \times 10^{-3}$ to $1 \times 10^{-2}$. When such a laminated insulating film is used, a single fundamental transverse mode is allowed to be maintained even in a high-power operation with over 100 milliwatts. Moreover, the second compound semiconductor layer may have, for example, a structure configured by laminating, in order, an undoped GaInN layer (p-side light guide layer), an undoped AlGaN layer (p-side cladding layer), a Mg-doped AlGaN layer (electron barrier layer), a GaN layer (Mg-doped)/AlGaN layer superlattice structure (superlattice cladding layer), and a Mg-doped GaN layer (p-side contact layer) from the third compound semiconductor layer side. It is desirable that the band gap of a compound semiconductor forming the well layer in the third compound semiconductor layer be 2.4 eV or more. Further, it is desirable that the wavelength of laser light emitted from the third compound semiconductor layer (active layer) be within a range of 360 nm to 500 nm, preferably 400 nm to 410 nm. Obviously, the above-described various configurations may be suitably combined.

As described above, in the second compound semiconductor layer, an undoped compound semiconductor layer (for example, an undoped GaInN layer or an undoped AlGaN layer) may be formed between the third compound semiconductor layer and an electronic barrier layer. Moreover, an undoped GaInN layer as an optical guide layer may be formed between the third compound semiconductor layer and the undoped compound semiconductor layer. The uppermost layer of the second compound semiconductor layer may be occupied by an Mg-doped GaN layer (p-side contact layer).

Various GaN-based compound semiconductor layers constituting the semiconductor light-emitting element in the technology are formed on a substrate in order, and in addition to a sapphire substrate, examples of the substrate include a GaAs substrate, a GaN substrate, a SiC substrate, an alumina substrate, a ZnS substrate, a ZnO substrate, an MN substrate, a LiMgO substrate, a LiGaO$_2$ substrate, a MgAl$_2$O$_4$ substrate, an InP substrate, a Si substrate, and one of these substrates with a surface (a main surface) where a base layer or a buffer layer is formed. In the case where the GaN-based compound semiconductor layer is formed on the substrate, the GaN substrate is typically preferable because of low defect density; however, it is known that the GaN substrate exhibits polarity, nonpolarity, or semipolarity depending on a growth plane. Further, methods of forming various GaN-based compound semiconductor layers constituting the semiconductor light-emitting element in the technology include metal organic chemical vapor deposition methods (a MOCVD method, a MOVPE method), a molecular beam epitaxy method (a MBE method), a hydride vapor deposition method in which halogens contribute to transport or reaction, and the like.

Examples of an organic gallium source gas in the MOCVD method include a trimethylgallium (TMG) gas and a triethylgallium (TEG) gas, and examples of a nitrogen source gas include an ammonia gas and a hydrazine gas. To form a GaN-based compound semiconductor layer of an n-type conductivity type, for example, silicon (Si) may be added as an n-type impurity (n-type dopant), and to form a GaN-based compound semiconductor layer of a p-type conductivity type, for example, magnesium (Mg) may be added as a p-type impurity (p-type dopant). When aluminum (Al) or indium (In) is included as a constituent atom of the GaN-based compound semiconductor layer, a trimethylaluminum (TMA) gas may be used as an Al source, and trimethylindium (TMI) gas may be used as an In source. In addition, a monosilane (SiH$_4$) gas may be used as a Si source, and a cyclopentadienylmagnesium gas, methylcyclopentadienylmagnesium, or bis(cyclopentadienyl)magnesium (Cp$_2$Mg) may be used as an Mg source. It is to be noted that in addition to Si, examples of the n-type impurity (n-type dopant) include Ge, Se, Sn, C, Te, S, O, Pd, and Po, and in addition to Mg, examples of the p-type impurity (p-type dopant) include Zn, Cd, Be, Ca, Ba, C, Hg, and Sr.

When the first conductivity type is of a n-type conductivity type, the first electrode electrically connected to the first compound semiconductor layer of the n-type conductivity type preferably has a single-layer structure or a multilayer structure including one or more kinds of metal selected from the group consisting of gold (Au), silver (Ag), palladium (Pd), aluminum (Al), titanium (Ti), tungsten (W), copper (Cu), zinc (Zn), tin (Sn), and indium (In), and examples of such a multilayer structure may include Ti/Au, Ti/Al, and Ti/Pt/Au. The first electrode is electrically connected to the first compound semiconductor layer, and states where the first electrode is electrically connected to the first compound semiconductor layer include a state where the first electrode is formed on the first compound semiconductor layer, and a state where the first electrode is connected to the first compound semiconductor layer through a conductive material layer or a conductive substrate. The first electrode and the second electrode are allowed to be formed by a PVD method such as a vacuum deposition method or a sputtering method.

A pad electrode may be formed on the first electrode or the second electrode to allow the first electrode or the second electrode to be electrically connected to an external electrode or circuit. It is desirable that the pad electrode have a single-layer structure or a multilayer structure including one or more kinds of metal selected from the group consisting of titanium (Ti), aluminum (Al), platinum (Pt), gold (Au), and nickel (Ni). Alternatively, the pad electrode may have a multilayer structure such as Ti/Pt/Au or Ti/Au.

The laser diode element in the technology may further include an external reflective mirror. In other words, the laser diode element may be an external resonator type laser diode element. Alternatively, the laser diode element may be a monolithic type laser diode element. It is to be noted that the external resonator type laser diode element may be of a condensing type or a collimating type. In the external resonator type laser diode element, light reflectivity of the light-emission end surface of the laminate structure body emitting an optical pulse is preferably 0.5% or less. It is to be noted that the light reflectivity is extremely lower than light reflectivity (typically within a range of 5% to 10%) of the light-emission end surface of the laminate structure body emitting an optical pulse in a laser diode element in related art. In the external resonator type laser diode element, it is desirable that an external resonator length (X', unit: mm) be 0<X'<1500, and preferably 30≤X'≤150.

The present technology is applicable to, for example, fields such as optical disk systems, the communications field, the optical information field, opto-electronic integrated circuits, fields of application of nonlinear optical phenomena, optical switches, various analysis fields such as the laser measurement field, the ultrafast spectroscopy field, the multiphase excitation spectroscopy field, the mass analysis field, the microspectroscopy field using multiphoton absorption, quantum control of chemical reaction, the nano three-dimensional processing field, various processing fields using multiphoton absorption, the medical fields, and the bio-imaging field.

Example 1

Figure 1B:
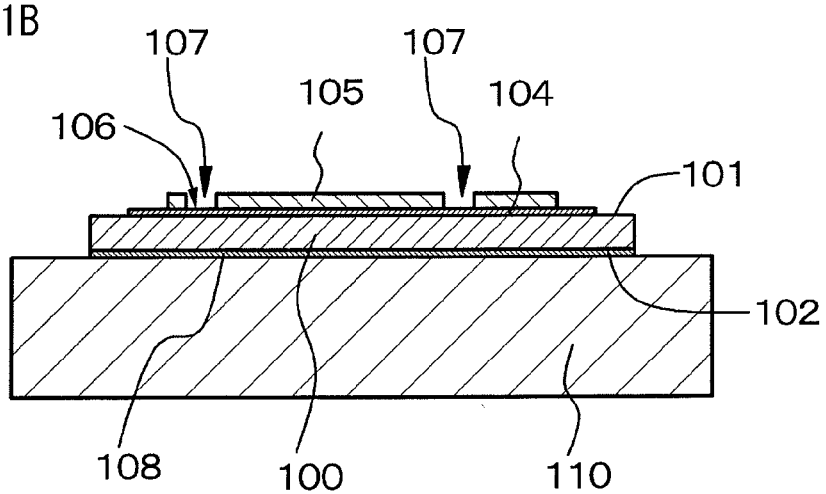
Figure 10:
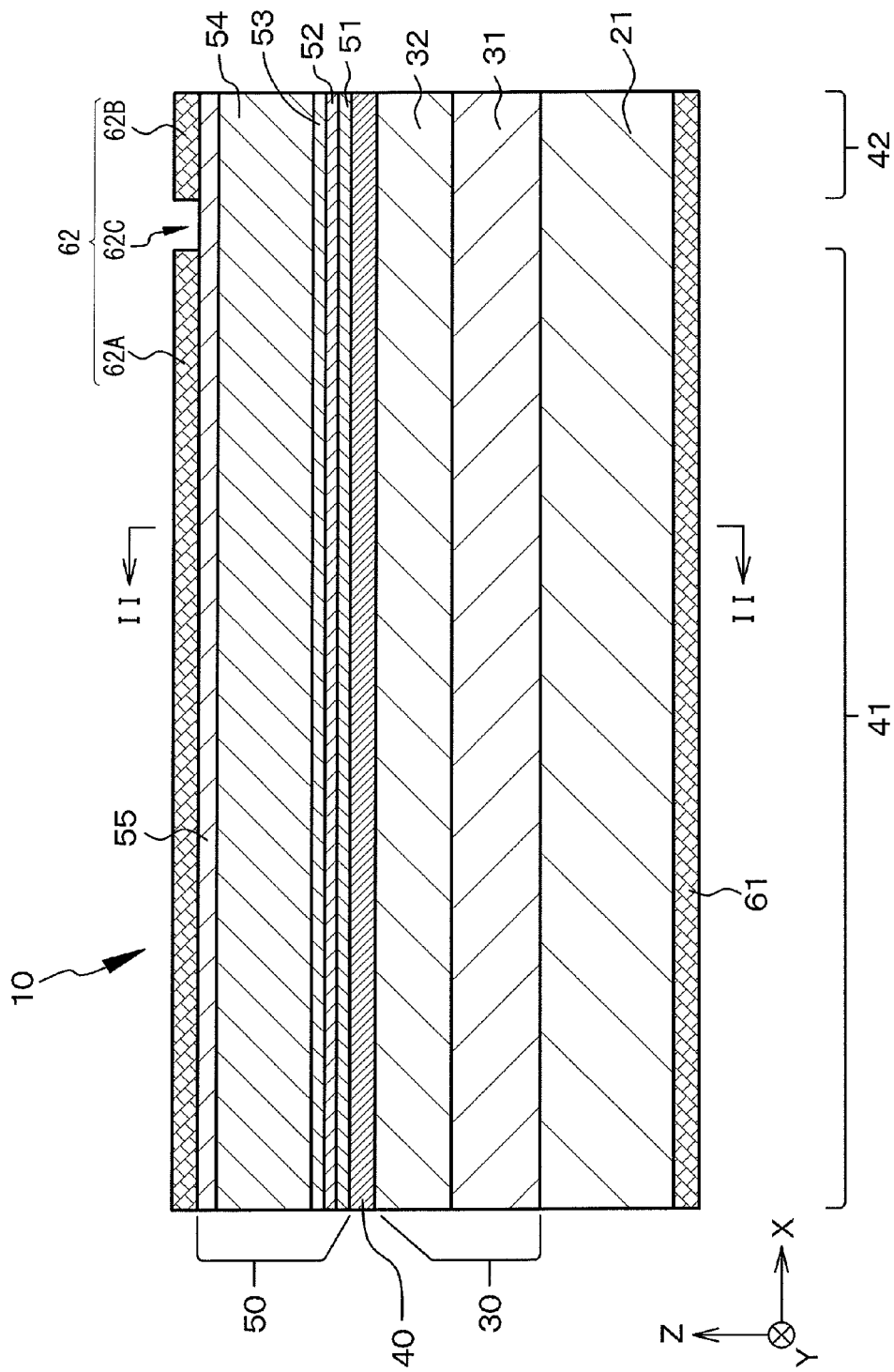
FIG. 10 is a schematic end view of a laser diode element in Example 1 taken along a virtual vertical plane including an axis line of a waveguide of the laser diode element.
Figure 11:
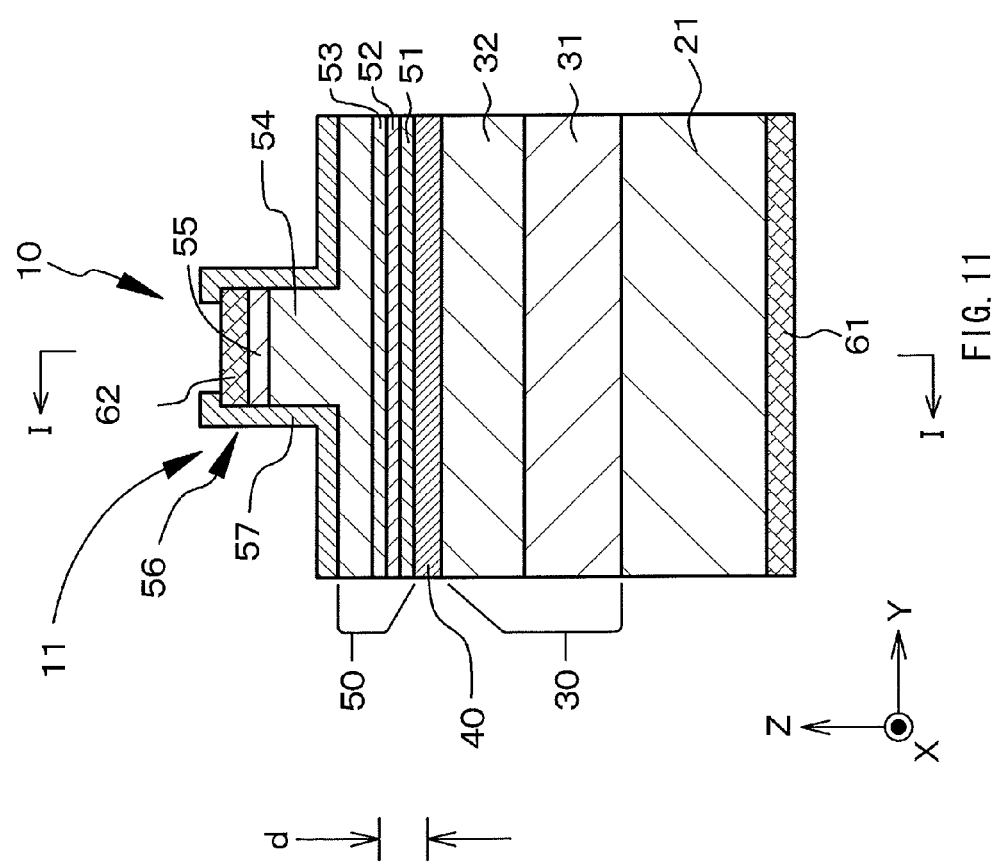
FIG. 11 is a schematic end view of the laser diode element in Example 1 taken along a virtual vertical plane orthogonal to the axis line of the waveguide of the laser diode element.

Example 1 relates to the submount according to the embodiment of the technology, the submount assembly according to the first embodiment of the technology, and the submount assembling method according to the first embodiment of the technology. FIG. 1A illustrates a schematic plan view of the submount assembly of Example 1, and FIG. 1B illustrates a schematic end view taken along an arrow B-B of FIG. 1A. Moreover, FIG. 10 illustrates a schematic end view of a laser diode element in Example 1 taken along a virtual vertical plane including an axis line of a waveguide of the laser diode element, and FIG. 11 illustrates a schematic end view of the laser diode element in Example 1 taken along a virtual vertical plane orthogonal to the axis line of the waveguide of the laser diode element. It is to be noted that FIG. 10 is a schematic end view taken along an arrow I-I of FIG. 11, and FIG. 11 is a schematic sectional view taken along an arrow II-II of FIG. 10.

A submount 100 in Example 1 is a submount allowing a semiconductor light-emitting element including a waveguide 11 to be fixed thereon, the waveguide 11 having an axis line inclined at $\theta_{WG}$ (degrees) with respect to a normal to a light-incident/emission end surface (specifically, a light-emission end surface in Example 1) of the semiconductor light-emitting element, and made of a semiconductor material with a refractive index $n_{LE}$, and the submount 100 is made of AlN. A first surface 101 where the semiconductor light-emitting element is mounted of the submount 100 is provided with a fusion-bonding material layer 103 for fixing the semiconductor light-emitting element, and an alignment mark 107 allowed to be recognized at an angle $\theta_{SM}=\sin^{-1}[n_{LE}\cdot\sin(\theta_{WG})/n_0]$, where a refractive index of a light-transmitting medium in proximity to the outside of the light-incident/emission end surface of the semiconductor light-emitting element is $n_0$, is formed in the fusion-bonding material layer 103. Further, a second surface 102 is provided with an adhesive layer 108.

A submount assembly of Example 1 includes the semiconductor light-emitting element of Example 1 and the submount 100 of Example 1 allowing the semiconductor light-emitting element to be fixed thereon. The submount assembly of Example 1 further includes a heat sink 110 allowing the submount 100 to be mounted thereon, and the submount 100 is mounted on the heat sink 110 with an adhesive layer 108 in between. The heat sink 110 is made of aluminum.

In Example 1, the semiconductor light-emitting element is configured of a laser diode element 10, and more specifically, a multi-section type (more specifically, bisection type) mode-locked laser diode element in which a light emission region and a saturable absorption region are apposed along the axis line of the waveguide (resonator). The laser diode element 10 is mounted on the submount 100 in a so-called junction-up manner.

The laser diode element 10 with an emission wavelength of 405 nm in Example 1 or Example 4 which will be described later is configured of one of the laser diode elements with the first to third configurations, and includes:

(a) a laminate structure body configured by laminating, in order, a first compound semiconductor layer 30 of a first conductivity type (specifically, an n-type conductivity type in each example) made of a GaN-based compound semiconductor, a third compound semiconductor layer (active layer) 40 made of a GaN-based compound semiconductor and having a light emission region (gain region) 41 and a saturable absorption region 42, and a second compound semiconductor layer 50 of a second conductivity type (specifically, a p-type conductivity type in each example) made of a GaN-based compound semiconductor, the second conductivity type being different from the first conductivity type;

(b) a second electrode 62 formed on the second compound semiconductor layer 50; and (c) a first electrode 61 electrically connected to the first compound semiconductor layer 30.

Specifically, the laser diode element 10 in Example 1 is a laser diode element having a ridge stripe type separate confinement heterostructure (SCH structure). More specifically, the laser diode element 10 is a GaN-based laser diode element made of index guide type AlGaInN developed for Blu-ray optical disk systems, including an oblique waveguide, and having a ridge stripe structure. Specifically, the first compound semiconductor layer 30, the third compound semiconductor layer 40, and the second compound semiconductor layer 50 are made of an AlGaInN-based compound semiconductor, and more specifically, in Example 1, they have layer structures illustrated in the following Table 1. In this case, compound semiconductor layers in Table 1 are listed in order of decreasing distance from the n-type GaN substrate 21. In addition, the band gap of a compound semiconductor forming a well layer in the third compound semiconductor layer 40 is 3.06 eV. The laser diode element 10 in Example 1 is disposed on a (0001) plane of the n-type GaN substrate 21, and the third compound semiconductor layer 40 has a quantum well structure. The (0001) plane of the n-type GaN substrate 21 is also called "C plane", and is a crystal plane having polarity.

TABLE 1

| | |
|---|---|
| Second compound semiconductor layer | 50 |
| p-type GaN contact layer (Mg-doped) | 55 |
| p-type GaN (Mg-doped)/AlGaN superlattice cladding layer | 54 |
| p-type AlGaN electronic barrier layer (Mg-doped) | 53 |
| Undoped AlGaN cladding layer | 52 |
| Undoped GaInN light guide layer | 51 |
| Third compound semiconductor layer GaInN quantum well active layer (Well layer: $Ga_{0.92}In_{0.08}N$/barrier layer: $Ga_{0.98}In_{0.02}N$) | 40 |
| First compound semiconductor layer | 30 |
| n-type GaN cladding layer | 32 |
| n-type AlGaN cladding layer | 31 |
| Herein, | |
| Well layer (two layers) | 10.5 nm   undoped |
| Barrier layer (three layers) | 14 nm   undoped |

Moreover, a part of the p-type GaN contact layer 55 and a part of the p-type GaN/AlGaN superlattice cladding layer 54 are removed by an RIE method to form a ridge stripe structure 56. A laminated insulating film 57 made of $SiO_2$/Si is formed on both sides of the ridge stripe structure 56. The $SiO_2$ layer is a lower layer, and the Si layer is an upper layer. In this case, a difference in effective refractive index between the ridge stripe structure 56 and the laminated insulating film 57 is within a range from $5 \times 10^{-3}$ to $1 \times 10^{-2}$ both inclusive, more specifically $7 \times 10^{-3}$. The second electrode (p-side ohmic electrode) 62 is formed on the p-type GaN contact layer 55 corresponding to a top surface of the ridge stripe structure 56. On the other hand, the first electrode (n-side ohmic electrode) 61 made of Ti/Pt/Au is formed on a back surface of the n-type GaN substrate 21. More specifically, the laminated insulating film 57 has a $SiO_2$/Si laminate structure, and the width of the ridge stripe structure is 1.5 μm.

In the laser diode element 10 in Example 1, the p-type AlGaN electronic barrier layer 53, the p-type GaN/AlGaN superlattice cladding layer 54, and the p-type GaN contact layer 55, which are Mg-doped compound semiconductor layers, overlap a light density distribution generated from the third compound semiconductor layer 40 and its surroundings as little as possible, thereby reducing internal loss without reducing internal quantum efficiency. As a result, a threshold current density at which laser oscillation starts is reduced. More specifically, a distance d from the third compound semiconductor layer 40 to the p-type AlGaN electronic barrier layer 53 is 0.10 μm, the height of the ridge stripe structure 56 is 0.30 μm, the thickness of the second compound semiconductor layer 50 disposed between the second electrode 62 and the third compound semiconductor layer 40 is 0.50 μm, and the thickness of a portion disposed below the second electrode 62 of the p-type GaN/AlGaN superlattice cladding layer 54 is 0.40 μm.

In the laser diode element 10 in Example 1, the second electrode 62 is separated by a separation groove 62C into a first section 62A and a second section 62B, the first section 62A configured to create a forward bias state by passing a DC current to the first electrode 61 through the light emission region (gain region) 41, the second section 62B configured to apply an electric field to the saturable absorption region 42 (the second section 62B configured to apply a reverse bias voltage $V_{sa}$ to the saturable absorption region 42). Herein, electrical resistance (may be referred to as a "separation resistance") between the first section 62A and the second section 62B of the second electrode 62 is $1 \times 10$ times or more, specifically $1.5 \times 10^3$ times as high as electrical resistance between the second electrode 62 and the first electrode 61. The electrical resistance (separation resistance) between the first section 62A and the second section 62B of the second electrode 62 is $1 \times 10^2 \Omega$ or more, specifically $1.5 \times 10^4 \Omega$.

In the laser diode element 10 in Example 1, a nonreflective coating layer (AR) or a low-reflective coating layer having reflectivity ($r_2$) of 0.5% or less, preferably reflectivity of 0.3% or less is formed on a light-emission end surface thereof facing a lens 12. On the other hand, a high-reflective coating layer (HR) having reflectivity ($r_1$) of 85% or more, preferably reflectivity of 95% or more is formed on an end surface facing the light-emission end surface in the laser diode element 10. The saturable absorption region 42 is disposed on an end surface side facing the light-emission end surface in the laser diode element 10. The nonreflective coating layer (the low-reflective coating layer) may have a laminate structure including two or more kinds of layers selected from the group consisting of a titanium oxide layer, a tantalum oxide layer, a zirconia oxide layer, a silicon oxide layer, and an aluminum oxide layer.

The pulse recurrence frequency of the laser diode element 10 in Example 1 is 1 GHz. Herein, a distance (X') between an end surface facing the light-emission end surface of the laser diode element 10 and an external resonator is 150 mm. The recurrence frequency f of an optical pulse train is determined by an external resonator length X', and is represented by the following formula. Herein, c is the speed of light, and n is a refractive index of a waveguide.

$$f = c/(2n \cdot X')$$

The resonator length of the laser diode element 10 is 600 μm, the lengths of the first section 62A, the second section 62B, and the separation groove 62C of the second electrode 62 are 550 μm, 30 μm, and 20 μm, respectively. In such a laser diode element 10, when a current passed through the first section 62A of the second electrode 62 is 100 milliamperes, and a reverse bias voltage applied to the first section 62A of the second electrode 62 is 18 V (−18 V), average power of 9.0 milliwatts is obtained at an operation temperature of 25° C.

In Example 1, as illustrated in FIG. 1A, and FIGS. 2 to 9, when the semiconductor light-emitting element is mounted on the submount 100, an axis line $AX_{SM}$ of the submount 100 and an axis line $AX_{LE}$ of the semiconductor light-emitting element intersect with each other at $\theta_{SM}$ (degrees). It is to be noted that in the drawings, only directions of the axis lines $AX_{SM}$ and $AX_{LE}$ are indicated by alternate long and short dashed lines. The positions of actual axis lines $AX_{SM}$ and $AX_{LE}$ are different from those illustrated in the drawings. Moreover, the fusion-bonding material layer 103 is provided with two or more point-like alignment marks 107, and a straight line connecting two of the alignment marks 107 intersects with the axis line of the submount 100 at $\theta_{SM}$ (degrees) or (90-$\theta_{SM}$) (degrees). Alternatively, the fusion-bonding material layer 103 is provided with one or more strip-like alignment marks 107, and the axis line of the alignment mark 107 intersects with the axis line of the submount 100 at $\theta_{SM}$ (degrees) or (90-$\theta_{SM}$) (degrees).

More specifically, as illustrated in FIG. 1A, the fusion-bonding material layer 103 is provided with four point-like alignment marks 107, and the four alignment marks 107 are arranged to allow a straight line connecting a first alignment mark 107 and a second alignment mark 107 and a straight line connecting a third alignment mark 107 and a fourth alignment mark 107 to intersect with the axis line of the submount 100 at $\theta_{SM}$ (degrees), and to allow a straight line connecting the first alignment mark 107 and the fourth alignment mark 107 and a straight line connecting the second alignment mark 107 and the third alignment mark 107 to intersect with the axis line of the submount 100 at (90-$\theta_{SM}$) (degrees).

Figure 2:
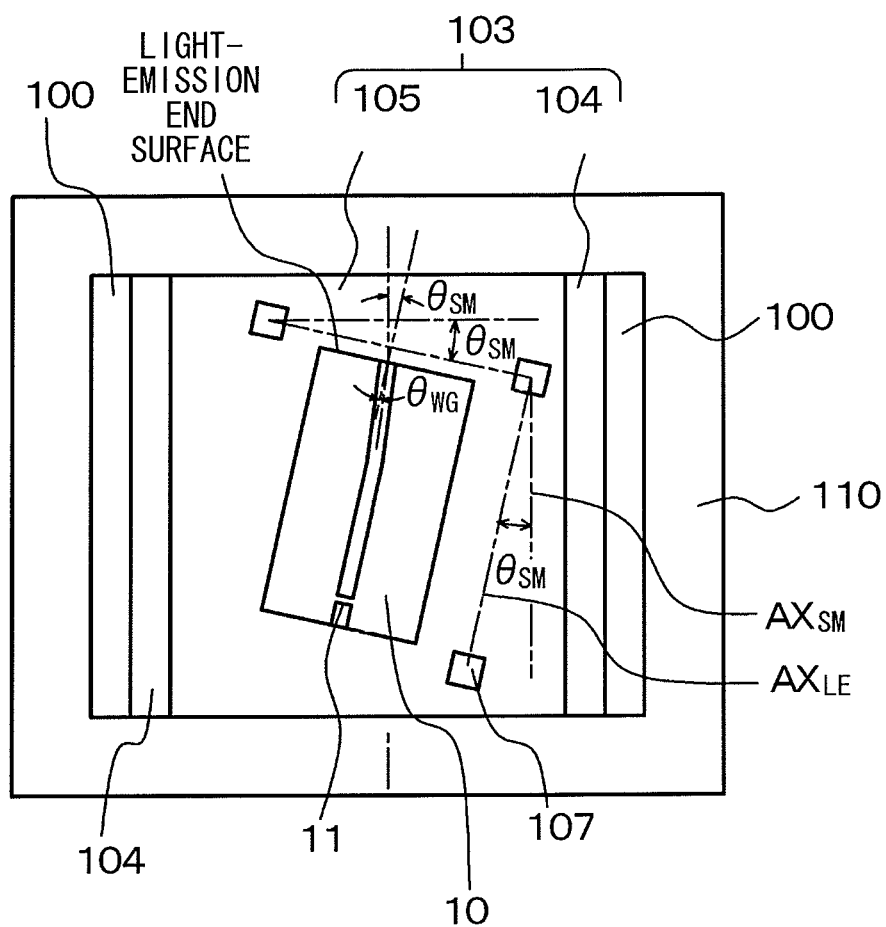
FIG. 2 is a schematic plan view of a modification of the submount assembly of Example 1.

Alternatively, as illustrated in FIG. 2, the fusion-bonding material layer 103 is provided with three point-like alignment marks 107, and the three alignment marks 107 are arranged to allow a straight line connecting the first alignment mark 107 and the second alignment mark 107 and a straight line connecting the second alignment mark 107 and the third alignment mark 107 to intersect with the axis line of the submount 100 at $\theta_{SM}$ (degrees) and (90-$\theta_{SM}$) (degrees), respectively.

Figure 3:
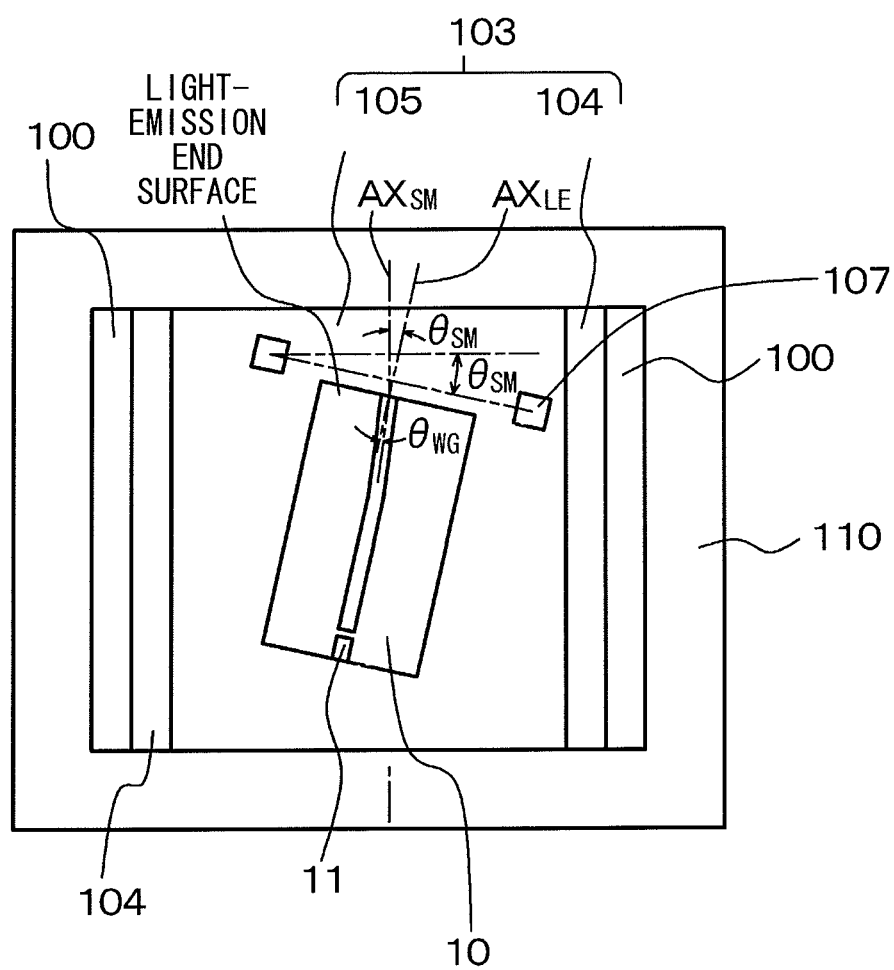
FIG. 3 is a schematic plan view of another modification of the submount assembly of Example 1.
Figure 4:
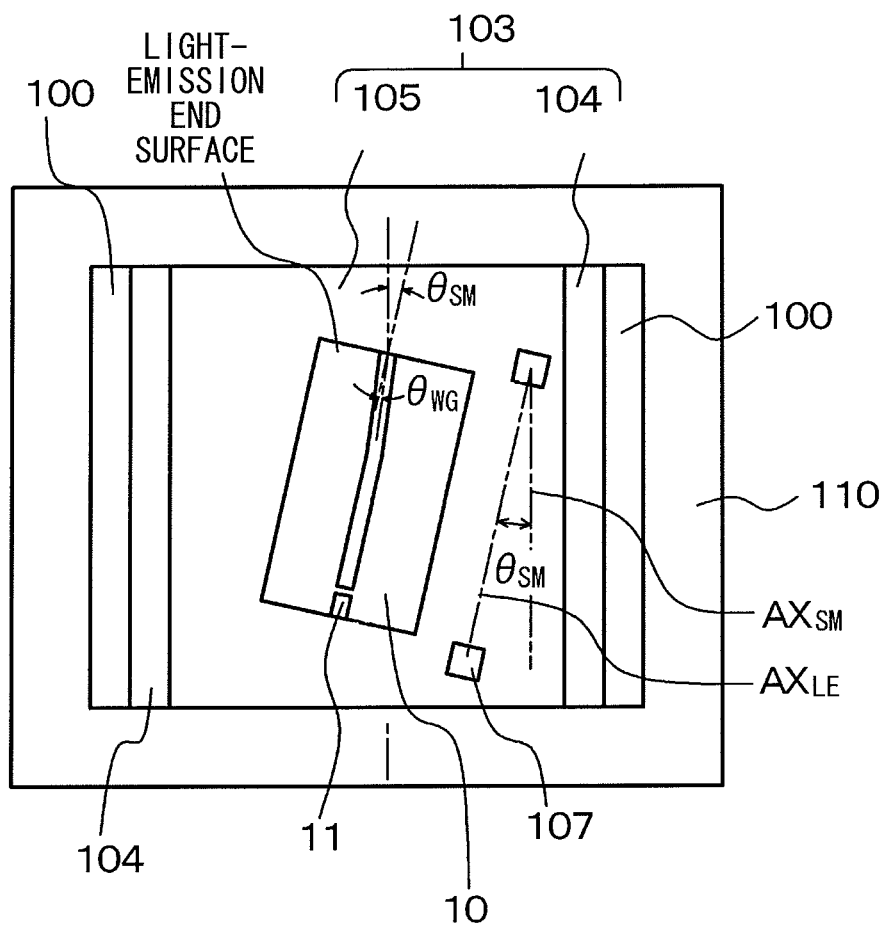
FIG. 4 is a schematic plan view of still another modification of the submount assembly of Example 1.

Alternatively, as illustrated in FIGS. 3 and 4, the fusion-bonding material layer 103 is provided with two point-like alignment marks 107, and the two alignment marks 107 are arranged to allow a straight line connecting the two alignment marks 107 to intersect with the axis line of the submount 100 at (90-$\theta_{SM}$) (degrees) (refer to FIG. 3) or $\theta_{SM}$ (degrees) (refer to FIG. 4).

Figure 5:
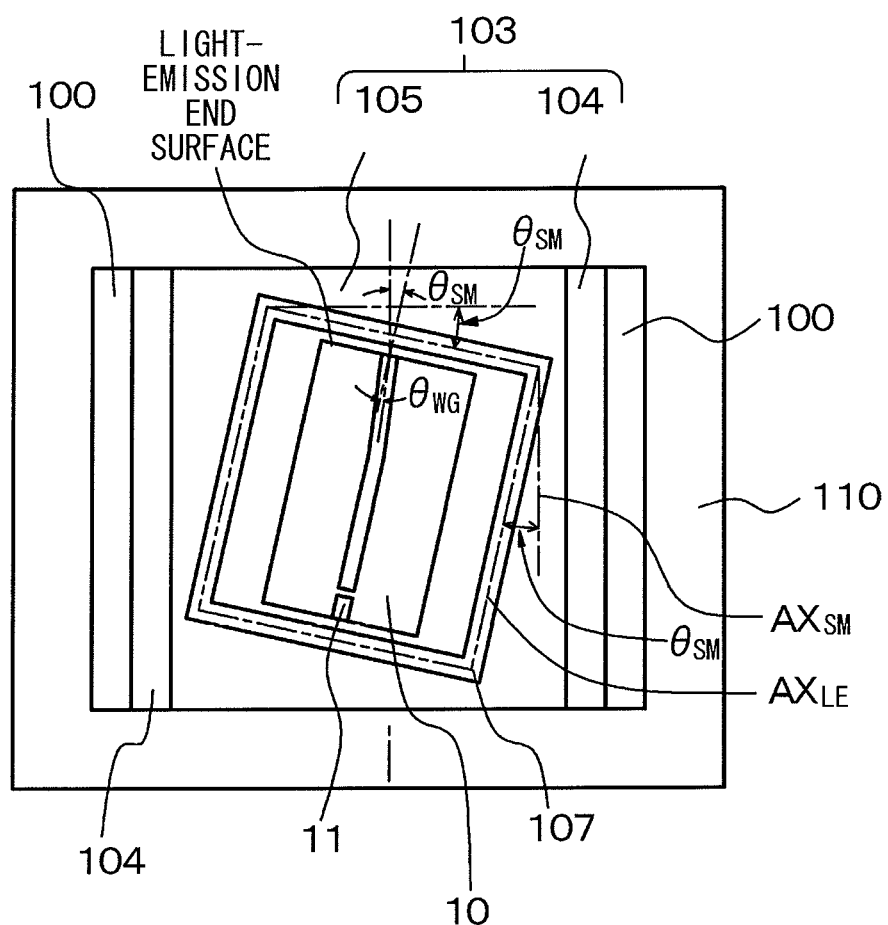
FIG. 5 is a schematic plan view of a further modification of the submount assembly of Example 1.

Alternatively, as illustrated in FIG. 5, the fusion-bonding material layer 103 is provided with four strip-like alignment marks 107, and the four strip-like alignment marks 107 are arranged to allow axis lines of a first strip-like alignment mark 107 and a third strip-like alignment mark 107 to intersect with the axis line of the submount 100 at $\theta_{SM}$ (degrees), and to allow axis lines of a second strip-like alignment mark 107 and a fourth strip-like alignment mark 107 to intersect with the axis line of the submount 100 at (90-$\theta_{SM}$) (degrees).

Figure 6:
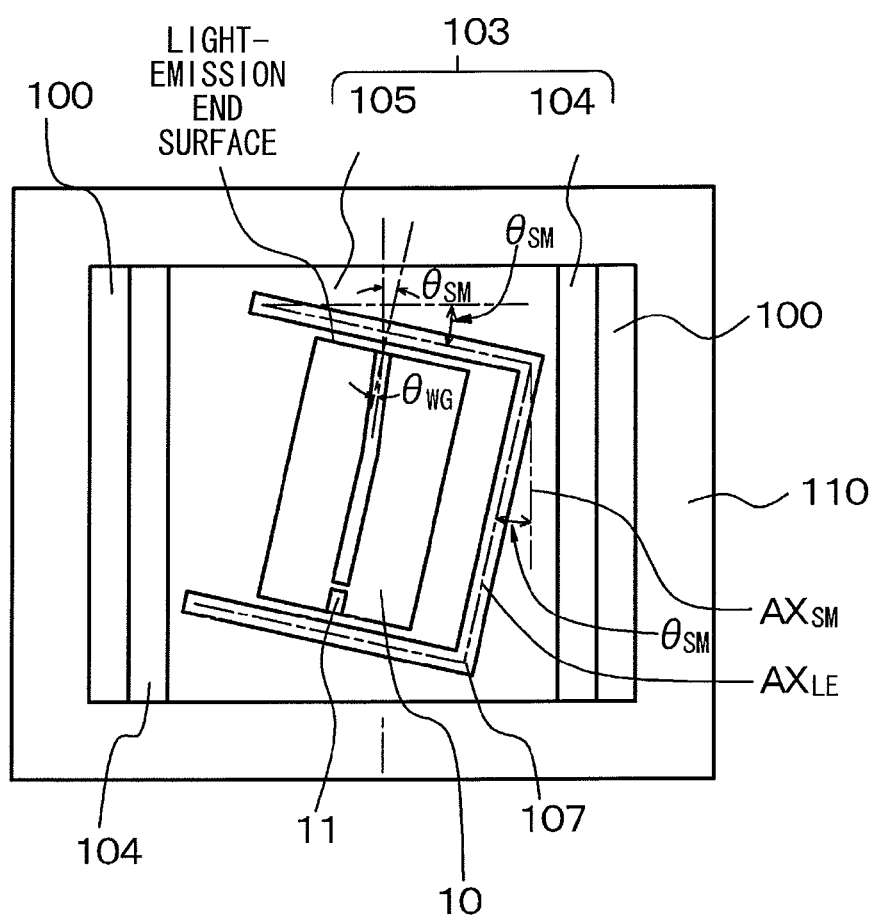
FIG. 6 is a schematic plan view of a still further modification of the submount assembly of Example 1.
Figure 7:
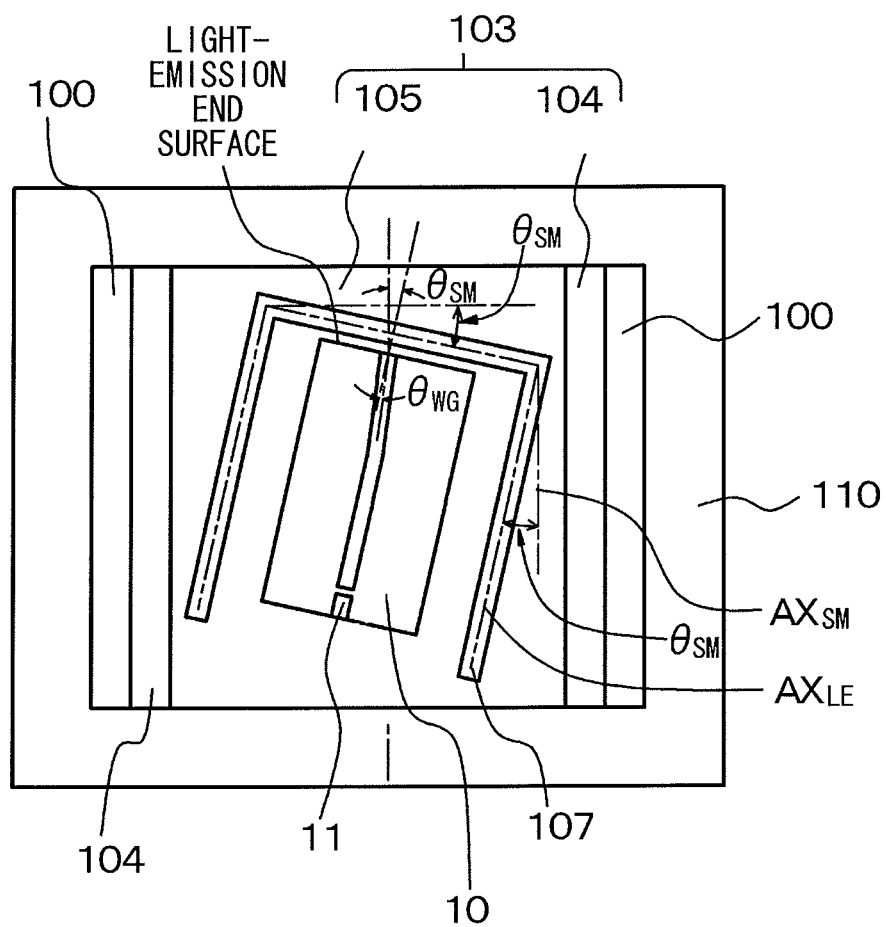
FIG. 7 is a schematic plan view of a still modification of the submount assembly of Example 1.

Alternatively, as illustrated in FIG. 6, the fusion-bonding material layer 103 is provided with three stripe-like alignment marks 107, and two of the three strip-like alignment marks 107 are arranged to allow axis lines of the two strip-like alignment marks 107 to intersect with the axis line of the submount 100 at (90-$\theta_{SM}$) (degrees), and the three strip-like alignment marks 107 are arranged to allow an axis line of the remaining one strip-like alignment mark 107 to intersect with the axis line of the submount 100 at $\theta_{SM}$ (degrees). Alternatively, as illustrated in FIG. 7, two of the three stripe-like alignment marks 107 are arranged to allow axis lines of the two strip-like alignment marks 107 to intersect with the axis line of the submount 100 at $\theta_{SM}$ (degrees), and the three strip-like alignment marks 107 are arranged to allow the axis line of the remaining one strip-like alignment mark 107 to intersect with the axis line of the submount 100 at (90-$\theta_{SM}$) (degrees).

Figure 8:
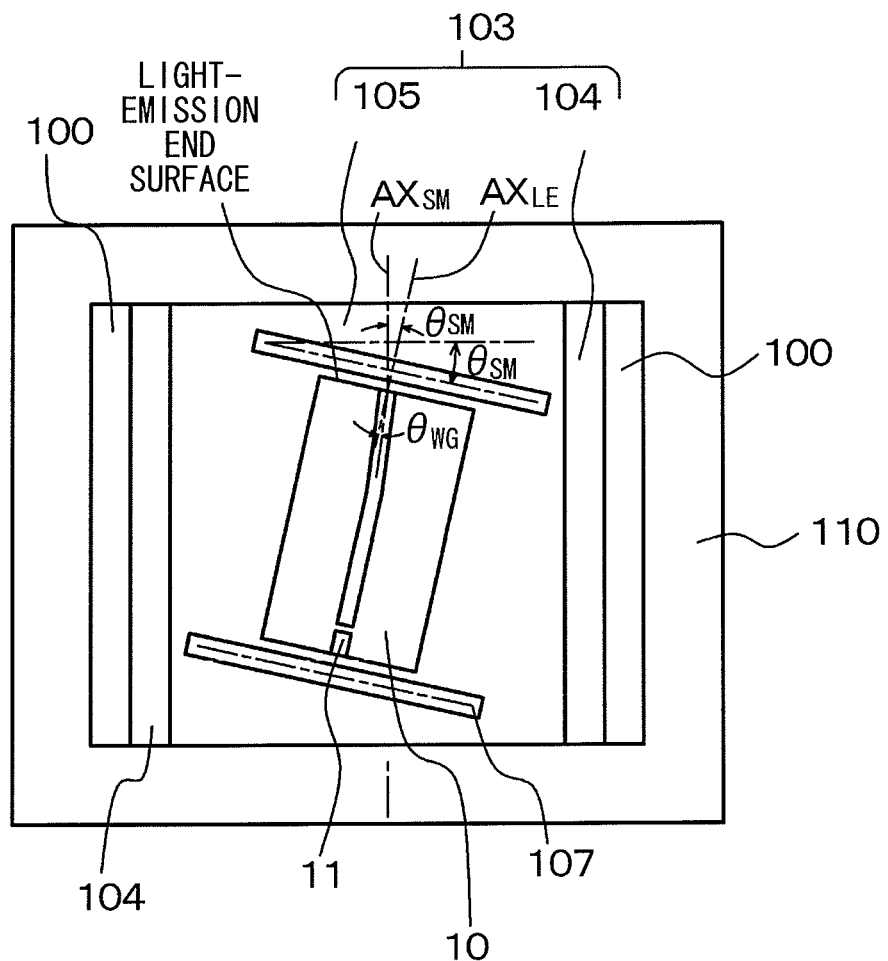
FIG. 8 is a schematic plan view of a still modification of the submount assembly of Example 1.
Figure 9:
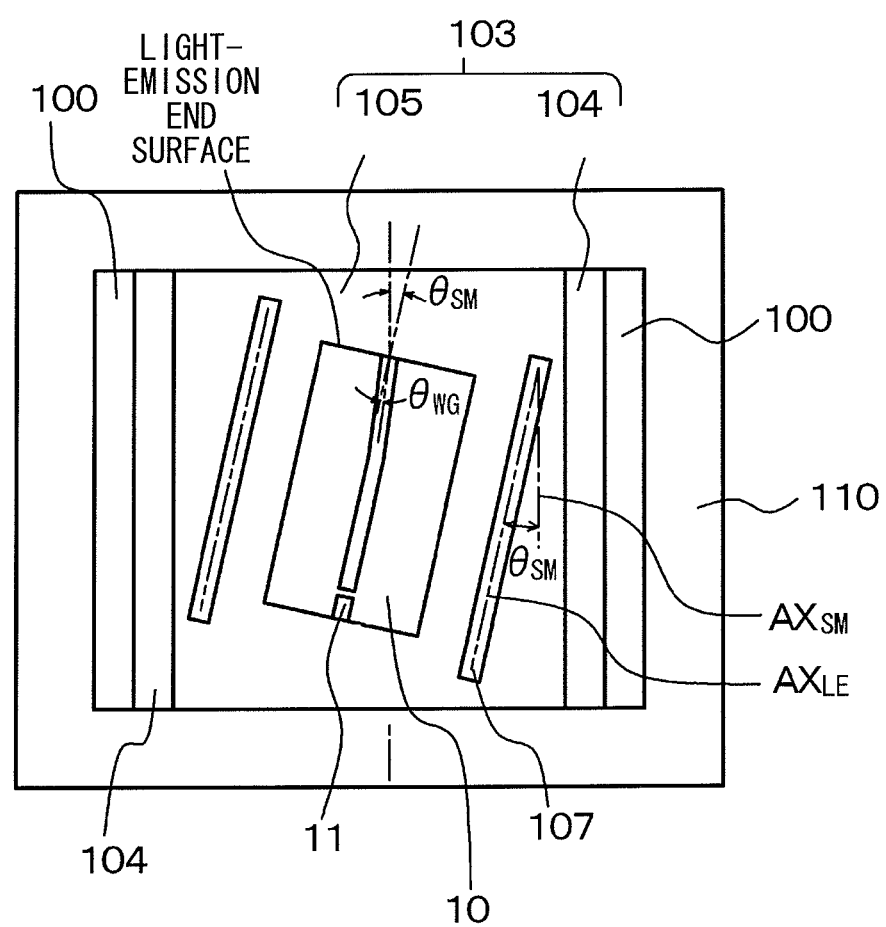
FIG. 9 is a schematic plan view of a still modification of the submount assembly of Example 1.

Alternatively, as illustrated in FIGS. 8 and 9, the fusion-bonding material layer 103 is provided with two strip-like alignment marks 107, and the two strip-like alignment marks 107 are arranged to allow axis lines thereof to intersect with the axis line of the submount 100 at (90-$\theta_{SM}$) (degrees), or to allow the axis lines thereof to intersect with the axis line of the submount 100 at $\theta_{SM}$ (degrees).

It is to be noted, although not illustrated, two strip-like alignment marks 107 may be arranged to allow an axis line of one of the strip-like alignment marks 107 and an axis line of the other strip-like alignment mark 107 to intersect with the axis line of the submount 100 at $\theta_{SM}$ (degrees) and (90-$\theta_{SM}$) (degrees), respectively. Moreover, the fusion-bonding material layer 103 may be provided with one strip-like alignment mark 107, and the one strip-like alignment mark 107 is arranged to allow an axis line thereof to intersect with the axis line of the submount 100 at $\theta_{SM}$ (degrees) or (90-$\theta_{SM}$) (degrees).

In Example 1, the fusion-bonding material layer 103 has a laminate structure including an Au layer 104 and an Au—Sn ($Au_{80}Sn_{20}$) alloy layer 105 in order from a first surface side, and the alignment mark 107 is configured of an opening 106 disposed in the Au—Sn alloy layer 105, and the Au layer 104 is exposed at a bottom of the opening 106. In the fusion-bonding material layer 103 with such a two-layer structure, a projection image of the Au—Sn alloy layer 105 is included in a projection image of the Au layer 104, thereby allowing a wiring line or the like to be connected to the Au layer 104 by a bonding process. It is to be noted that the Au layer 104 and the Au—Sn alloy layer 105 are formed by, for example, a vacuum deposition method. Moreover, the opening 106 (the alignment mark 107) is allowed to be formed by, for example, a liftoff method.

In the illustrated submount assembly of Example 1, the alignment mark 107 does not overlap the semiconductor light-emitting element. However, the alignment mark 107 is not limited to such a state, and the alignment mark 107 may overlap the semiconductor light-emitting element. In this case, it is necessary for the semiconductor light-emitting element to be made of a material (for example, a GaN-based compound semiconductor) allowing the alignment mark 107 to be recognized through the semiconductor light-emitting element from above, or a component disposed above the alignment mark 107 of the semiconductor light-emitting element may be made of a transparent material.

An angle $\theta_{WG}$ is within a range of $0.1° \leq \theta_{WG} \leq 10°$, preferably within a range of $2° \leq \theta_{WG} \leq 6°$ as an example. In Example 1, more specifically, the angle $\theta_{WG}$ is $5.0°$. It is to be noted that the angle $\theta_{SM}$ is $12.6°$, where $n_{LE}=2.5$, and $n_0=1.0$.

As described above, it is desirable that the second electrode 62 having separation resistance of $1 \times 10^2 \Omega$ or more be formed on the second compound semiconductor layer 50. In the case of the GaN-based laser diode element, unlike a GaAs-based laser diode element in related art, as mobility in a p-type conductivity type compound semiconductor is small, without increasing resistance by performing ion implantation or the like on the second compound semiconductor layer 50 of the p-type conductivity type, the second electrode 62 formed on the second compound semiconductor layer 50 of the p-type conductivity type is separated by the separation groove 62C, thereby allowing electrical resistance between the first section 62A and the second section 62B of the second electrode 62 to be 10 or more times as high as electrical resistance between the second electrode 62 and the first electrode 61, or allowing electrical resistance between the first section 62A and the second section 62B of the second electrode 62 to be $1 \times 10^2 \Omega$ or more.

Necessary characteristics for the second electrode 62 are as follows.

(1) The second electrode 62 functions as an etching mask when the second compound semiconductor layer 50 is etched.

(2) The second electrode 62 is allowed to be wet-etched without deteriorating optical and electrical characteristics of the second compound semiconductor layer 50.

(3) The second electrode 62 has contact resistivity of $10^{-2}$ $\Omega \cdot cm^2$ or less when the second electrode 62 is formed on the second compound semiconductor layer 50.

(4) When the second electrode 62 has a laminate structure, a material forming a lower metal layer has a large work function, and low contact resistivity with respect to the second compound semiconductor layer 50, and is allowed to be wet-etched.

(5) When the second electrode 62 has a laminate structure, a material forming an upper metal layer has resistance to etching (for example, a $Cl_2$ gas used in a RIE method) performed when a ridge stripe structure is formed, and is allowed to be wet-etched.

In the laser diode element 10 in Example 1, the second electrode 62 is configured of a Pd single layer with a thickness of 0.1 μm.

It is to be noted that the p-type GaN/AlGaN superlattice cladding layer 54 having a superlattice structure in which p-type GaN layers and p-type AlGaN layers are alternately laminated has a thickness of 0.7 μm or less, more specifically 0.4 μm, and the p-type GaN layer constituting the superlattice structure has a thickness of 2.5 nm, and the p-type AlGaN layer constituting the superlattice structure has a thickness of 2.5 nm, and the total layer number of the p-type GaN layers and the p-type AlGaN layers is 160 layers. Moreover, a distance from the third compound semiconductor layer 40 to the second electrode 62 is 1 μm or less, more specifically 0.5 μm. Further, the p-type AlGaN electronic barrier layer 53, the p-type GaN/AlGaN superlattice cladding layer 54, and the p-type GaN contact layer 55 constituting the second compound semiconductor layer 50 are doped with $1 \times 10^{19}$ cm$^{-3}$ or more (more specifically, $2 \times 10^{19}$ cm$^{-3}$) of Mg, and the absorption coefficient of the second compound semiconductor layer 50 with respect to light with a wavelength of 405 nm is 50 cm$^{-1}$ or more, more specifically 65 cm$^{-1}$. Moreover, the second compound semiconductor layer 50 includes, from the third compound semiconductor layer 40 side, undoped compound semiconductor layers (the undoped GaInN light guide layer 51 and the undoped AlGaN cladding layer 52) and p-type compound semiconductor layers, and a distance (d) from the third compound semiconductor layer 40 to the p-type compound semiconductor layers (specifically, the p-type AlGaN electron barrier layer 53) is $1.2 \times 10^{-7}$ m or less, specifically 100 nm.

Figure 26:
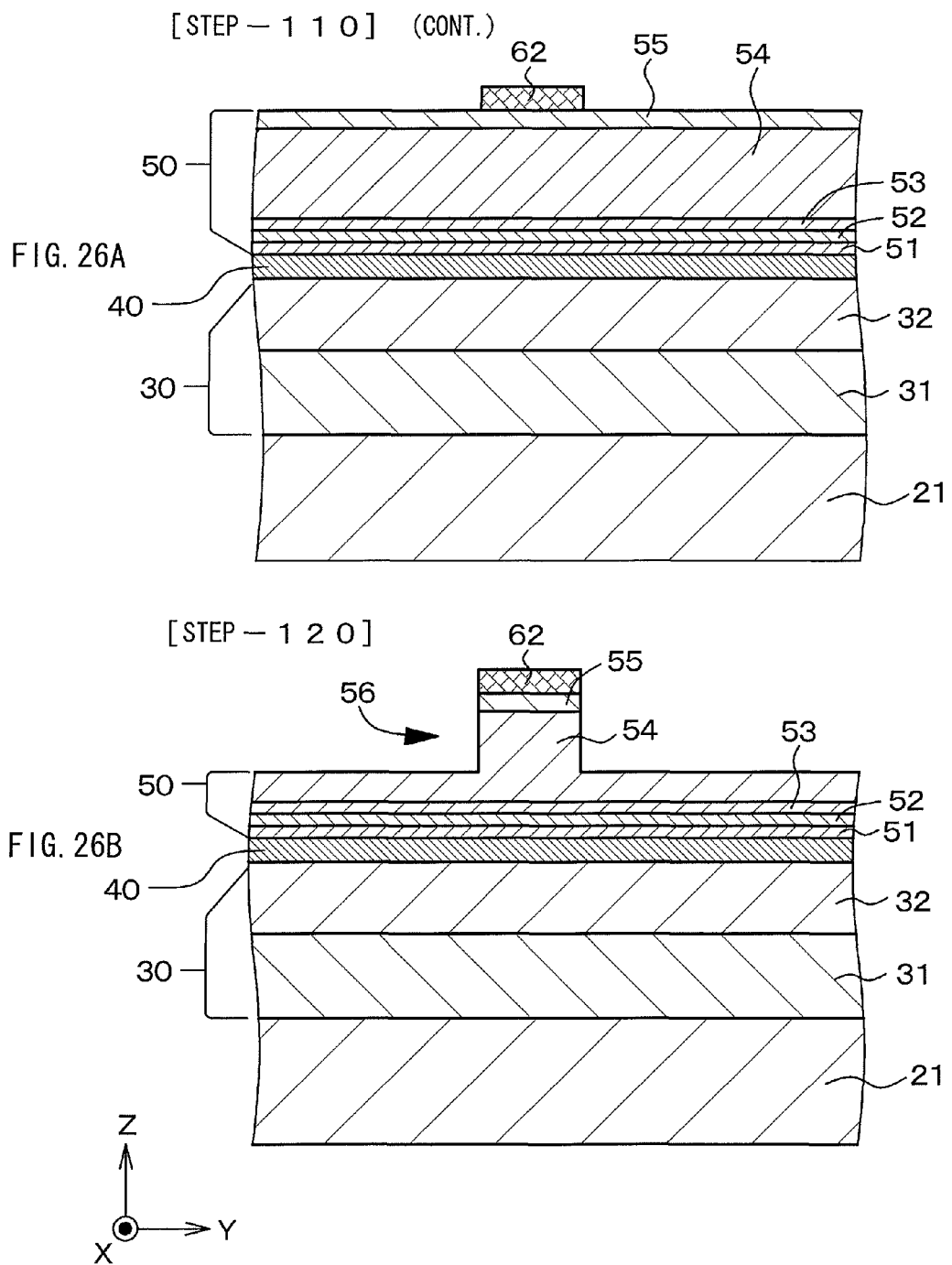
FIGS. 26A and 26B are schematic partial sectional views of the substrate and the like for describing the method of manufacturing the laser diode element of Example 1 following FIG. 25B.
Figure 27:
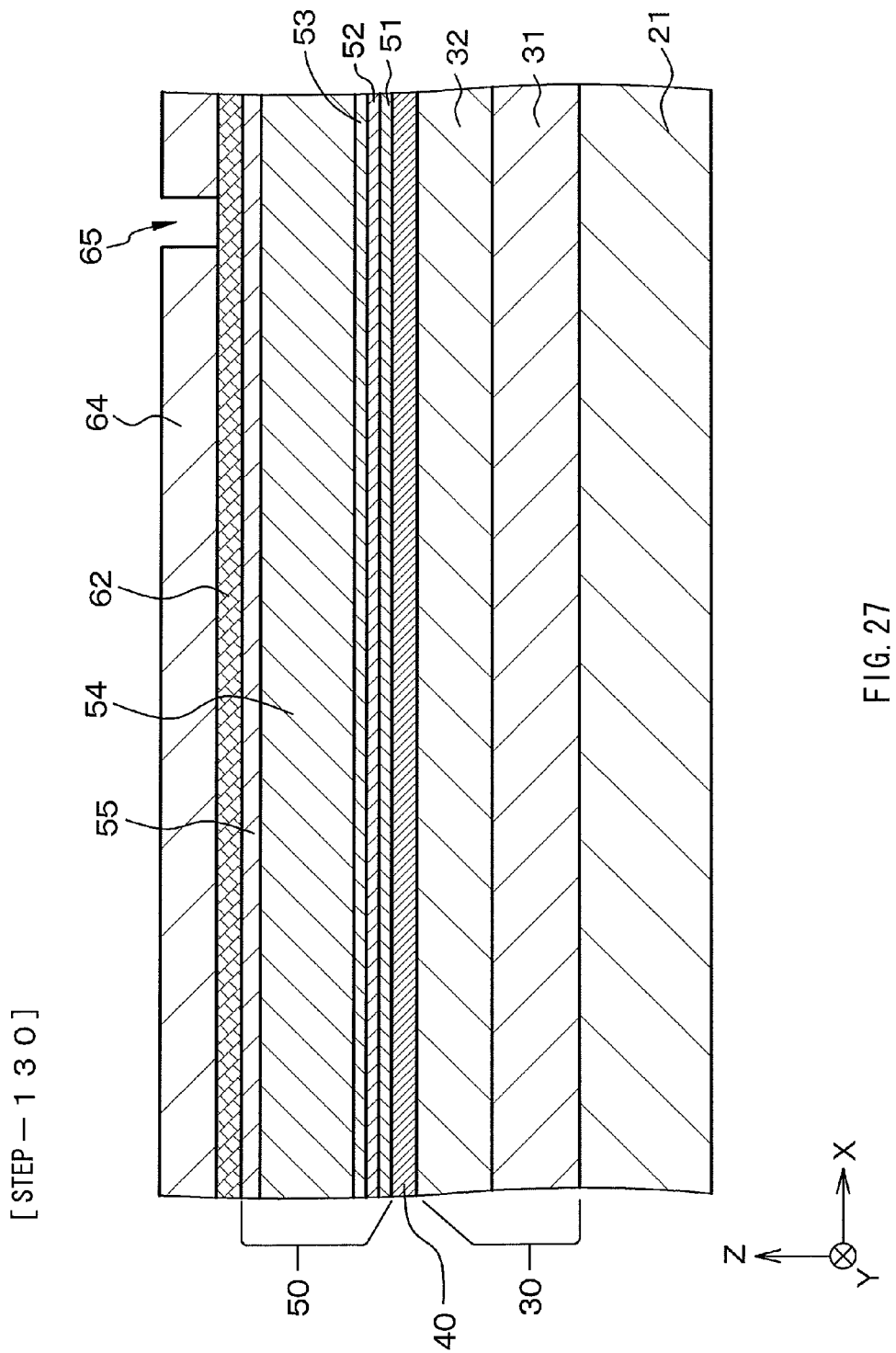
FIG. 27 is a schematic partial end view of the substrate and the like for describing the method of manufacturing the laser diode element of Example 1 following FIG. 26B.

A method of manufacturing the mode-locked laser diode element in Example 1 will be described below referring to FIGS. 25A, 25B, 26A, 26B, and 27. It is to be noted that FIGS. 25A, 25B, 26A, and 26B are schematic partial sectional views of a substrate and the like taken along a substantially YZ plane, and FIG. 27 is a schematic partial end view of the substrate and the like taken along a substantially XZ plane.

[Step—100]

Figure 25:
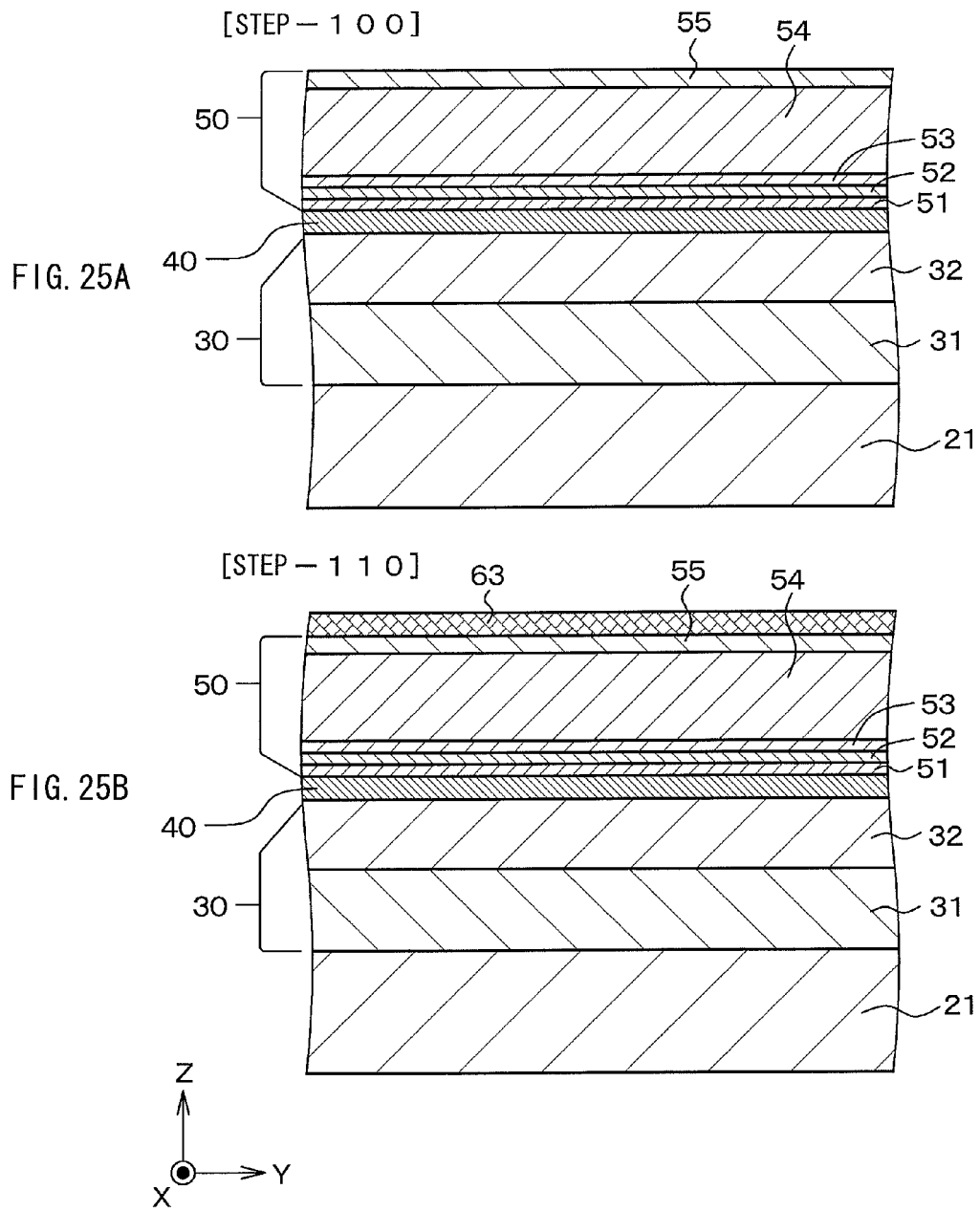
FIGS. 25A and 25B are schematic partial sectional views of a substrate and the like for describing a method of manufacturing the laser diode element of Example 1.

First, a laminate structure body configured by laminating, in order, the first compound semiconductor layer 30 of the first conductivity type (the n-type conductivity type) made of a GaN-based compound semiconductor, the third compound semiconductor layer (active layer) 40 made of a GaN-based compound semiconductor and having the light emission region (gain region) 41 and the saturable absorption region 42, and the second compound semiconductor layer 50 of the second conductivity type (the p-type conductivity type) made of a GaN-based compound semiconductor, the second conductivity type being different from the first conductivity type is formed on a base, more specifically, on a (0001) plane of the n-type GaN substrate 21 by a known MOCVD method (refer to FIG. 25A).

[Step—110]

After that, the second electrode 62 is formed on the second compound semiconductor layer 50. More specifically, the Pd layer 63 is entirely formed by a vacuum deposition method (refer to FIG. 25B), and then a resist layer for etching is formed on the Pd layer 63 by a photolithography technique. Then, a part not covered with the resist layer for etching of the Pd layer 63 is removed with use of aqua regia, and then the resist layer for etching is removed. Thus, a structure illustrated in FIG. 26A is allowed to be obtained. It is to be noted that the second electrode 62 may be formed on the second compound semiconductor layer 50 by a liftoff method.

[Step—120]

Next, the ridge stripe structure 56 is formed by etching a part or a whole of the second compound semiconductor layer 50 (more specifically, by etching a part of the second compound semiconductor layer 50) with use of the second electrode 62 as an etching mask. More specifically, a part of the second compound semiconductor layer 50 is etched by a RIE method using a Cl$_2$ gas with use of the second electrode 62 as an etching mask. Thus, a structure illustrated in FIG. 26B is allowed to be obtained. As the ridge stripe structure 56 is formed through a self-alignment system with use of, as an etching mask, the second electrode 62 patterned into a strip shape, misalignment does not occur between the second electrode 62 and the ridge stripe structure 56.

[Step—130]

After that, the resist layer 64 for forming the separation groove in the second electrode 62 is formed (refer to FIG. 27). It is to be noted that a reference numeral 65 indicates an opening disposed in the resist layer 64 to form the separation groove. Next, the separation groove 62C is formed in the second electrode 62 by a wet-etching method with use of the resist layer 64 as a wet-etching mask to separate the second electrode 62 by the separation groove 62C into the first section 62A and the second section 62B. More specifically, the separation groove 62C is formed in the second electrode 62 by immersing the entire structure in aqua regia used as an etchant for approximately 10 seconds. Then, the resist layer 64 is removed. Thus, a structure illustrated in FIGS. 10 and 11 is allowed to be obtained. Thus, when the wet-etching method, but not a dry-etching method, is adopted in such a manner, optical and electrical characteristics of the second compound semiconductor layer 50 are not deteriorated. Therefore, light emission characteristics of the laser diode element are not deteriorated. It is to be noted that in the case where the dry-etching method is adopted, internal loss $\alpha_i$ of the second compound semiconductor layer 50 may be increased to cause an increase in threshold voltage or a decline in light output. In this case, $ER_0/ER_1 \approx 1 \times 10^2$ is established, where the etching rate of the second electrode 62 is $ER_0$, and the etching rate of the laminate structure body is $ER_1$. Since there is a high etching selection ratio between the second electrode 62 and the second compound semiconductor layer 50, the second electrode 62 is allowed to be etched reliably without etching the laminate structure body (or with only slightly etching the laminate structure body). It is to be noted that it is desirable to satisfy $ER_0/ER_1 \geq 1 \times 10$, preferably $ER_0/ER_1 \geq 1 \times 10^2$.

The second electrode 62 may have a laminate structure including a lower metal layer made of palladium (Pd) with a thickness of 20 nm and an upper metal layer made of nickel (Ni) with a thickness of 200 nm. In wet-etching with use of aqua regia, the etching rate of nickel is approximately 1.25 times as high as that of palladium.

[Step—140]

After that, the formation of an n-side electrode, cleavage of a substrate, and the like are performed.

[Step—150]

Next, a method of assembling the submount assembly of Example 1 is executed. More specifically, the submount 100 and the semiconductor light-emitting element (the laser diode element 10) are aligned with respect to the alignment marks 107, and then the fusion-bonding material layer 103 is fused and cooled to allow the semiconductor light-emitting element (the laser diode element 10) to be mounted on the submount 100. More specifically, the alignment marks 107 are detected by an image recognition apparatus, and a straight line SL$_1$ and a straight line SL$_2$ connecting respective alignment marks 107 are determined. As the Au layer 104 is exposed at the bottom of the opening 106, the alignment marks 107 are easily detectable by the image recognition apparatus. Then, a robot arm grasping the laser diode element 10 is moved and rotated to allow two facing sides and other two facing sides of the laser diode element 10 to be parallel to the straight line SL1 and the straight line SL2, respectively, and further to allow a center of the laser diode element 10 to be positioned at a center of the submount 100, and then the robot arm is moved down to place the laser diode element 10 on the submount 100. More specifically, the first electrode 61 and the fusion-bonding material layer 103 are brought into contact with each other. Then, the fusion-bonding material layer 103 is heated and fused by a heater, and after that, the heater is stopped to cool down the fusion-bonding material layer 103, thereby mounting the laser diode element 10 on the submount 100.

[Step—160]

After that, the submount 100 and the heat sink 110 are aligned to allow respective sides of the submount 100 and corresponding sides of the heat sink 110 to be parallel to each other, and the adhesive layer 108 is heated and fused by a heater, and after that, the heater is stopped to cool down the adhesive layer 108, thereby mounting the submount 100 on the heat sink 110. Moreover, packaging is performed to obtain the submount assembly.

It is to be noted that [Step-150] and [Step-160] may be performed concurrently, or [Step-150] may be performed after performing [Step-160].

Typically, resistance R (Ω) of a semiconductor layer is represented by the following formula with use of resistivity ρ (Ω·m) of a material forming the semiconductor layer, the length $X_0$ (m) of the semiconductor layer, the sectional area S (m$^2$) of the semiconductor layer, carrier density n (cm$^{-3}$), electrical charge e (C), and mobility μ (m$^2$/Vs).

$$R = (\rho \cdot X_0)/S$$
$$= X_0/(n \cdot e \cdot \mu \cdot S)$$

Since the mobility of a p-type GaN-based semiconductor is two or more orders of magnitude smaller than that of a p-type GaAs-based semiconductor, electrical resistance is easily increased. Therefore, it is clear from the above formula that a laser diode element having a ridge stripe structure with a small sectional area of 1.5 μm in width by 0.30 μm in height has large electrical resistance.

As a result of measuring electrical resistance between the first section 62A and the second section 62B of the second electrode 62 of the formed laser diode element 10 by a four-terminal method, the electrical resistance between the first section 62A and the second section 62B of the second electrode 62 was 15 kΩ in the case where the width of the separation groove 62C was 20 μm. Moreover, when, in the formed laser diode element 10, a DC current was passed from the first section 62A of the second electrode 62 to the first electrode 61 through the light emission region 41 to create a forward bias state, and an electric field was applied to the saturable absorption region 42 by applying a reverse bias voltage $V_{sa}$ between the first electrode 61 and the second section 62B of the second electrode 62, a mode-locking operation was allowed to be performed. In other words, the electrical resistance between the first section 62A and the second section 62B of the second electrode 62 was 10 or more times as high as electrical resistance between the second electrode 62 and the first electrode 61, or 1×10$^2$Ω or more. Therefore, a leakage current flowing from the first section 62A of the second electrode 62 to the second section 62B is allowed to be reliably suppressed, and as a result, the light emission region 41 is allowed to be brought into a forward bias state, and the saturable absorption region 42 is allowed to be reliably brought into a reverse bias state, thereby allowing a self-pulsation operation in a single mode to be reliably achieved.

Figure 12A:
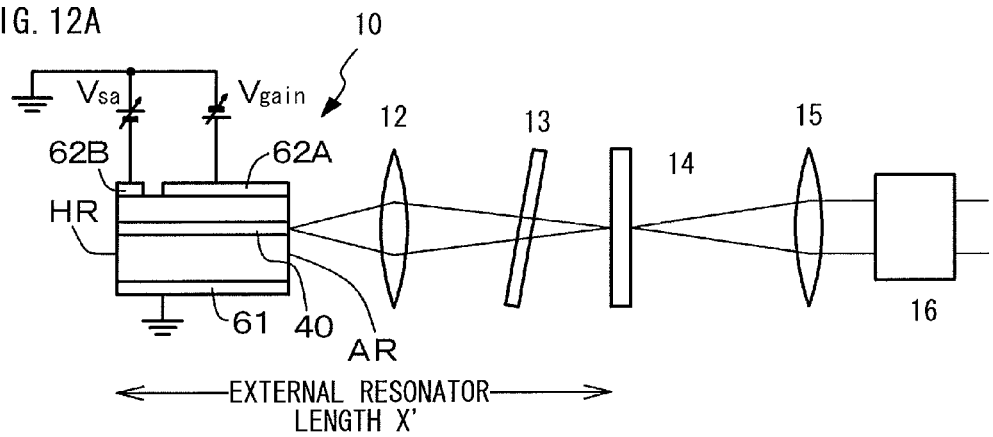
FIGS. 12A and 12B are schematic diagrams illustrating a system performing a mode-locking drive by forming an external resonator with use of a mode-locked laser diode element in Example 1 to perform a mode-locking drive.
Figure 12B:
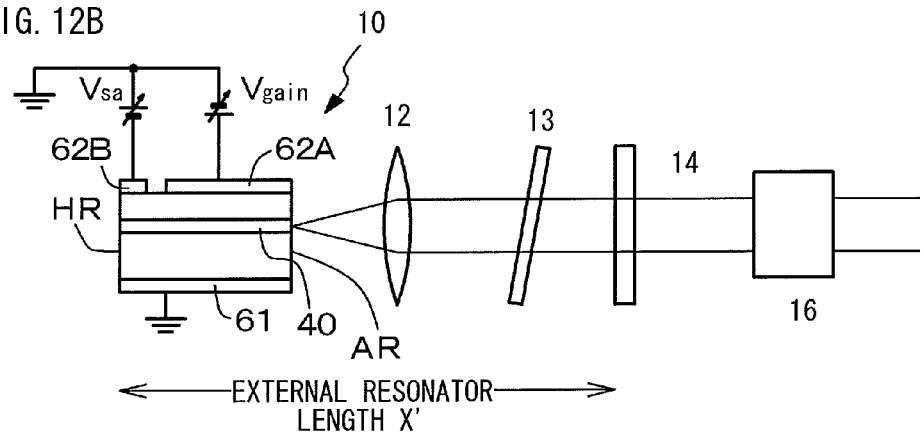

Light output devices configured of a condensing type external resonator with use of the laser diode element in Example 1 to perform a mode-locking operation are illustrated in FIGS. 12A and 12B. In these light output devices, a laser light source is configured of the mode-locked laser diode element 10, a lens 12, an optical filter 13, an external mirror 14, and a lens 15. Laser light emitted from the laser light source exits through an optical isolator 16. In a condensing type external resonator illustrated in FIG. 12A, the external resonator is configured of an end surface where a high-reflective coating layer (HR) is formed on the saturable absorption region side of the laser diode element and the external mirror 14, and an optical pulse is extracted from the external mirror 14. A nonreflective coating layer (AR) is formed on the light-emission end surface of the laser diode element. As the optical filter, mainly a bandpass filter is used, and the optical filter is inserted to control the oscillation wavelength of a laser. It is to be noted that mode-locking is determined by a DC current applied to the light emission region and the reverse bias voltage $V_{sa}$ applied to the saturable absorption region. Alternatively, also in a collimating type external resonator illustrated in FIG. 12B, the external resonator is configured of the end surface where the high-reflective coating layer (HR) is formed on the saturable absorption region side of the laser diode element and the external mirror 14, and an optical pulse is extracted from the external mirror 14. The nonreflective coating layer (AR) is formed on an end surface (light-emission end surface) of the laser diode element on the light emission region (gain region) side.

Figure 13A:
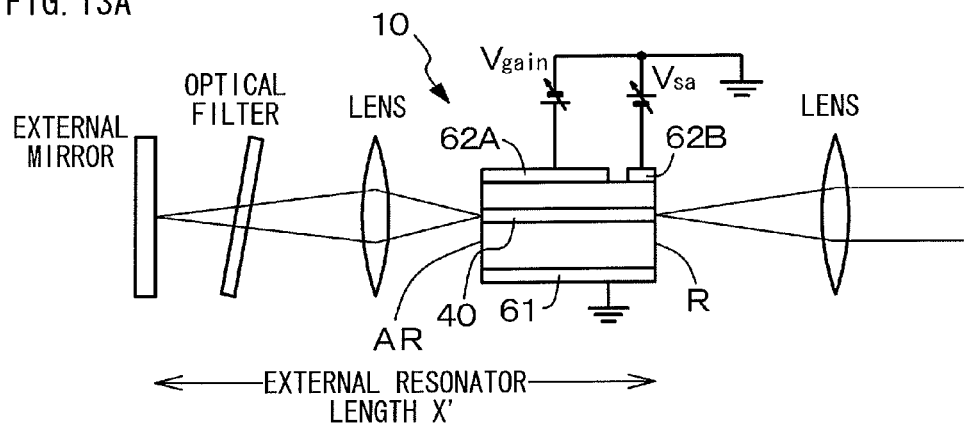
FIGS. 13A, 13B, and 13C are schematic diagrams illustrating the system performing a mode-locking drive by forming the external resonator with use of the laser diode element in Example 1.
Figure 13B:
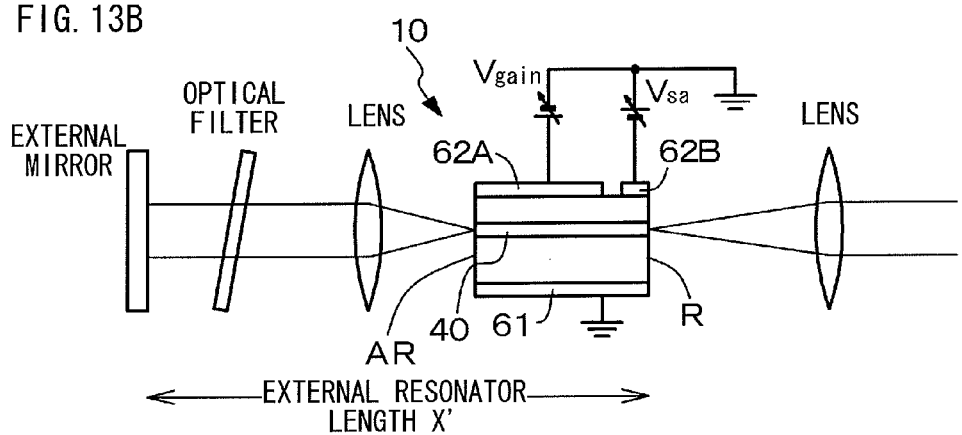
Figure 13C:
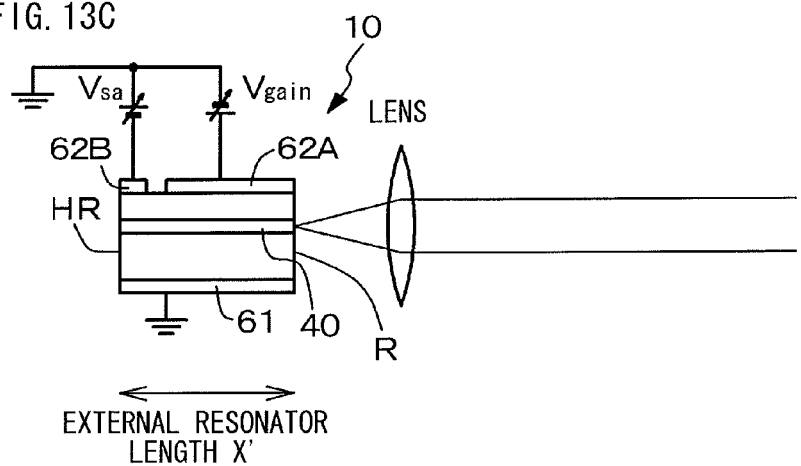

In external resonators illustrated in FIGS. 13A and 13B, the external resonators each are configured of an end surface where a reflective coating layer (R) is formed on the saturable absorption region side (the light-emission end surface) of the laser diode element and the external mirror, and an optical pulse is extracted from the saturable absorption region 42. The low-reflective coating layer (AR) is formed on an end surface on the light emission region (gain region) side of the mode-locked laser diode element. It is to be noted that examples illustrated in FIGS. 13A and 13B are a condensing type and a collimating type, respectively. Alternatively, as illustrated in FIG. 13C, the laser diode element may be of a monolithic type.

Example 2

Figure 14:
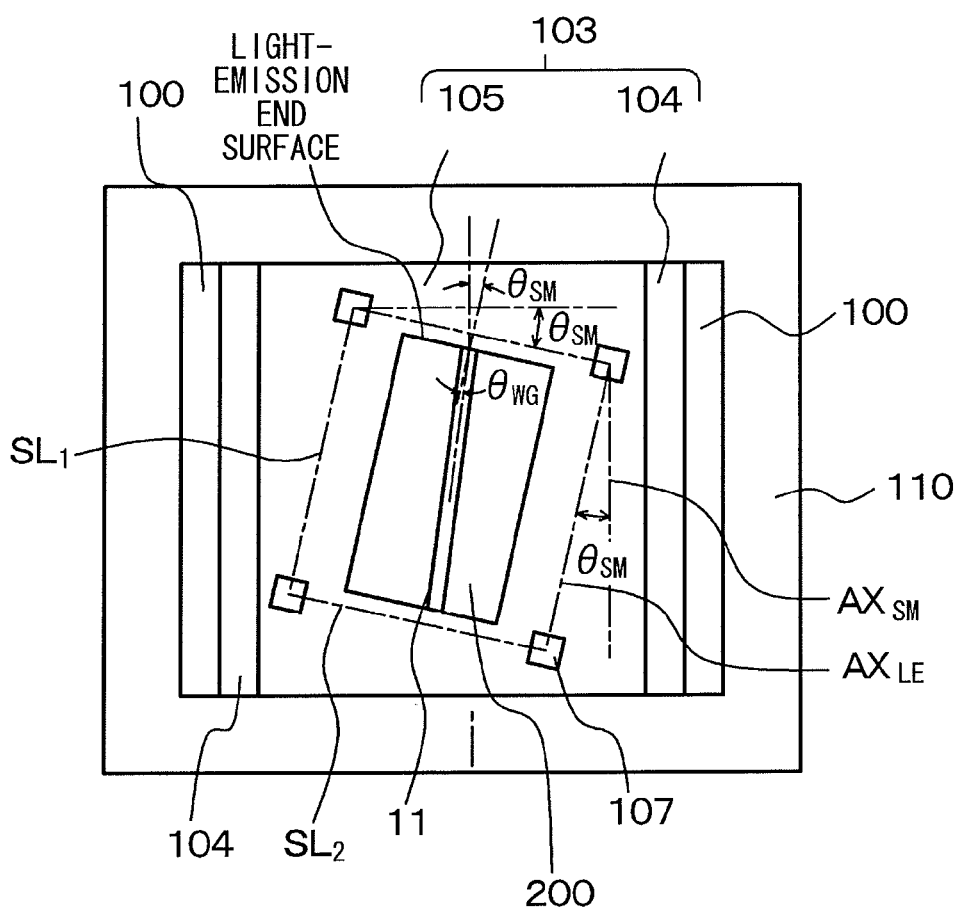
FIG. 14 is a schematic plan view of a submount assembly of Example 2.
Figure 15:
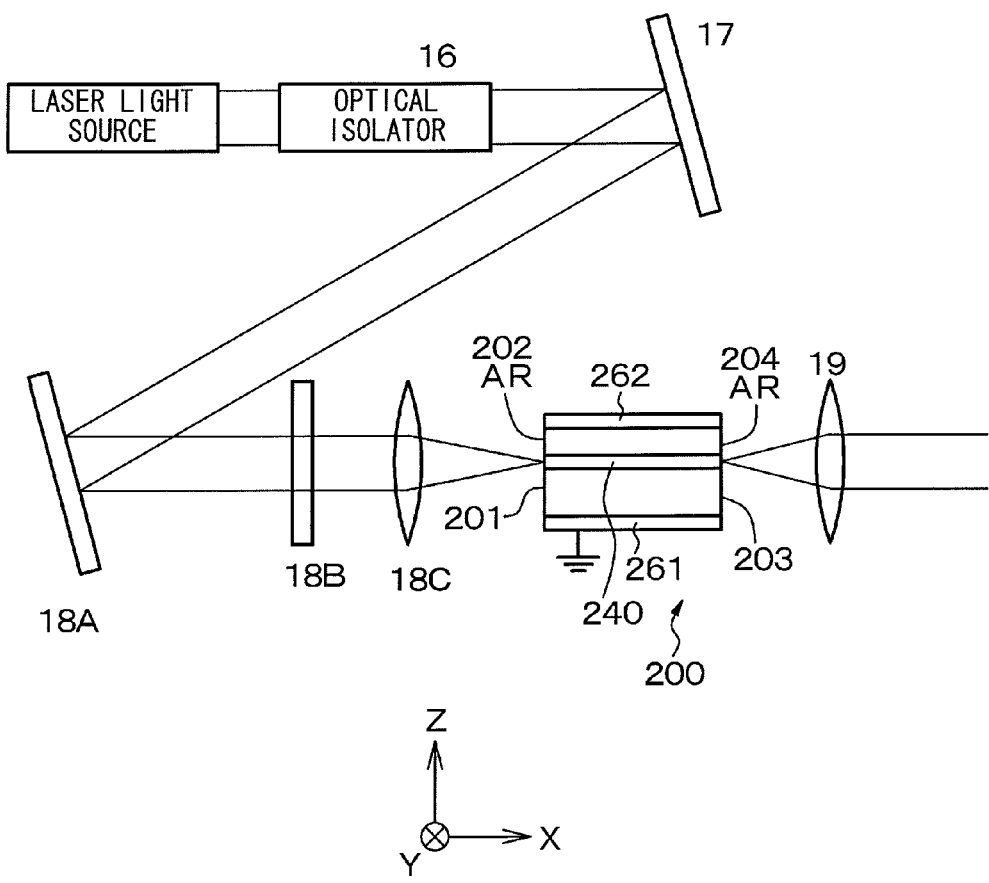
FIG. 15 is a conceptual diagram of a light output device of Example 2 including a semiconductor optical amplifier.
Figure 16:
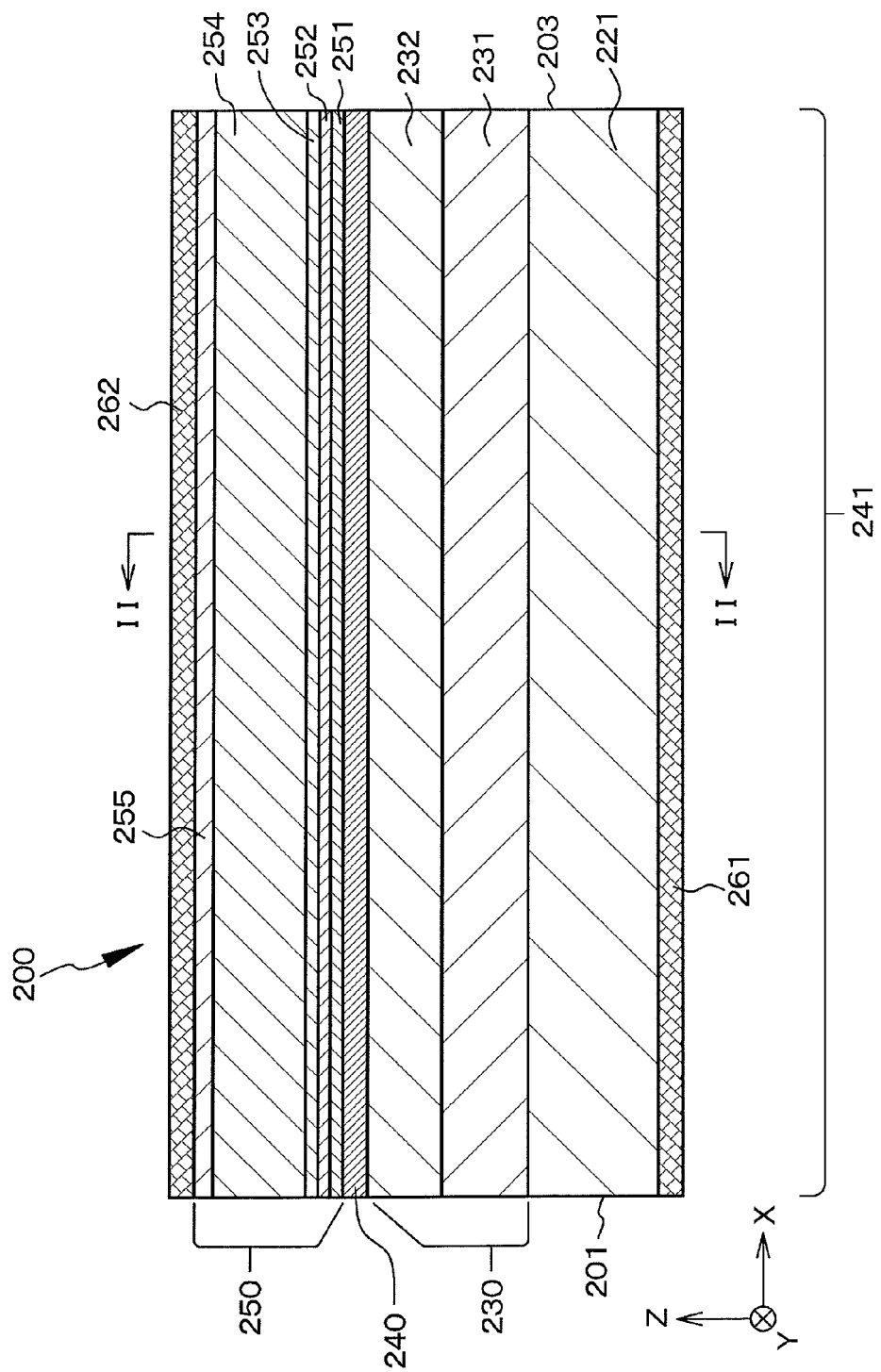
FIG. 16 is a schematic sectional view of a semiconductor optical amplifier of Example 2 taken along a virtual vertical plane including an axis line of the semiconductor optical amplifier.
Figure 17:
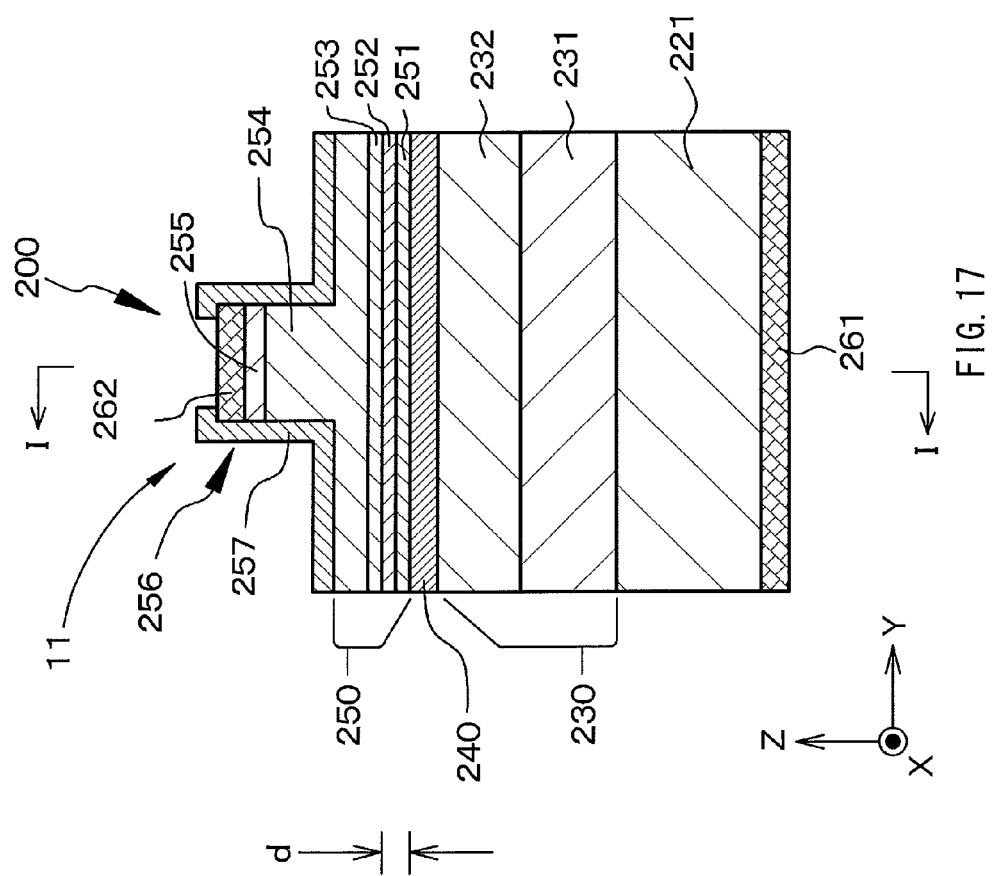
FIG. 17 is a schematic sectional view of the semiconductor optical amplifier of Example 2 taken along a virtual vertical plane orthogonal to the axis line of the semiconductor optical amplifier.

Example 2 is a modification of Example 1. In Example 2, the semiconductor light-emitting element is configured of a semiconductor optical amplifier (SOA, semiconductor laser amplifier) 200. FIG. 14 illustrates a schematic plan view of a submount assembly of Example 2, FIG. 15 illustrates a conceptual diagram of a light output device of Example 2 including a conceptual diagram of the semiconductor optical amplifier, FIG. 16 illustrates a schematic sectional view of the semiconductor optical amplifier taken along a virtual vertical plane including an axis line (a direction where a waveguide extends, an X direction) of the semiconductor optical amplifier, and FIG. 17 illustrates a schematic sectional view of the semiconductor optical amplifier taken along a virtual vertical plane orthogonal to the axis line of the semiconductor optical amplifier. It is to be noted that FIG. 16 is a schematic sectional view taken along an arrow I-I of FIG. 17, and FIG. 17 is a schematic sectional view taken along an arrow II-II of FIG. 16.

More specifically, the semiconductor optical amplifier 200 is configured of a transmissive semiconductor optical amplifier, and includes:

(a) a laminate structure body configured by laminating, in order, a first compound semiconductor layer 230 of a first conductivity type (specifically, an n-type conductivity type in Example 2) made of a GaN-based compound semiconductor, a third compound semiconductor layer (active layer) 240 made of a GaN-based compound semiconductor and having an optical amplification region (carrier injection region, a gain region) 241, and a second compound semiconductor layer 250 of a second conductivity type (specifically, a p-type conductivity type in Example 2) made of a GaN-based compound semiconductor, the second conductivity type being different from the first conductivity type;

(b) a second electrode 262 formed on the second compound semiconductor layer 250; and (c) a first electrode 261 electrically connected to the first compound semiconductor layer 230.

Low-reflective coating layers (AR) 202 and 204 (not illustrated in FIGS. 16, 20, and 21) are formed on a light-incident end surface 201 and a light-emission end surface 203 facing the light-incident end surface 201 of the semiconductor optical amplifier 200. In this case, the low-reflective coating layers each have, for example, a laminate structure including two or more kinds of layers selected from the group consisting of a titanium oxide layer, a tantalum oxide layer, a zirconia oxide layer, a silicon oxide layer, and an aluminum oxide layer. Then, laser light incident from a light-incident end surface 201 side is optically amplified in the semiconductor optical amplifier 200 to exit from the light-emission end surface 203 on an opposite side. The laser light is principally guided to only one direction. Moreover, in Example 2, the laser light source is configured of the mode-locked laser diode element 10 described in Example 1, and pulse laser light emitted from the mode-locked laser diode element 10 enters the semiconductor optical amplifier 200. In this case, the laser light source emits pulse laser light according to a mode-locking operation. The semiconductor optical amplifier 200 in Example 2 has substantially the same structure and configuration as those in Example 1, except for the structures and configurations of the mode-locked laser diode element 10, the second electrode, and the light-incident/emission end surface. In the semiconductor optical amplifier 200, a second electrode 262 is not provided with the separation groove. In this case, the same components in the semiconductor optical amplifiers 200 of Examples 2 and 3 as those in the laser diode element described in Example 1 are indicated by the same reference numerals incremented by 200.

The submount, the submount assembly, a method of assembling a submount assembly in Example 2 are similar to those described in Example 1, and will not be further described in detail, except for the configuration of the semiconductor light-emitting element different from that in Example 1.

In the light output device of Example 2 illustrated in FIG. 15, as described in Example 1, the laser light source is configured of the mode-locked laser diode element 10, the lens 12, the optical filter 13, the external mirror 14, and the lens 15. Then, laser light emitted from the laser light source enters a reflective mirror 18A through the optical isolator 16 and a reflective mirror 17. The laser light reflected by the reflective mirror 18A passes through a half-wave plate ($\lambda/2$ wave plate) 18B and a lens 18C to enter the semiconductor optical amplifier 200. It is to be noted that the half-wave plate ($\lambda/2$ wave plate) 18B is disposed to prevent returned light from the semiconductor optical amplifier 200 from heading to the laser light source. Then, the laser light is optically amplified in the semiconductor optical amplifier 200 to exit from the device through a lens 19.

Figure 18A:
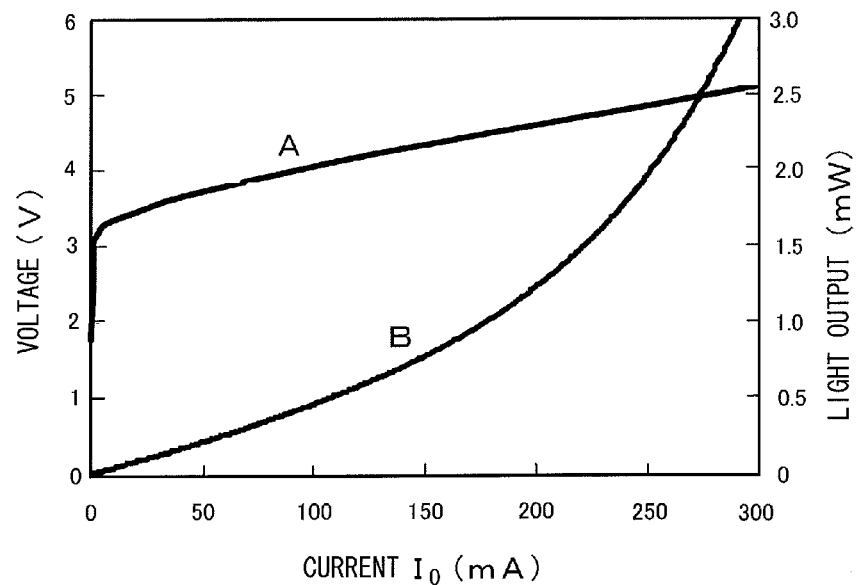
FIGS. 18A and 18B are a graph indicating a light output when a current is passed from a second electrode to a first electrode and a voltage applied between the second electrode and the first electrode in the semiconductor optical amplifier of Example 2, and a graph indicating a light output when a current is passed from the second electrode to the first electrode in the semiconductor optical amplifier of Example 2, respectively.
Figure 18B:
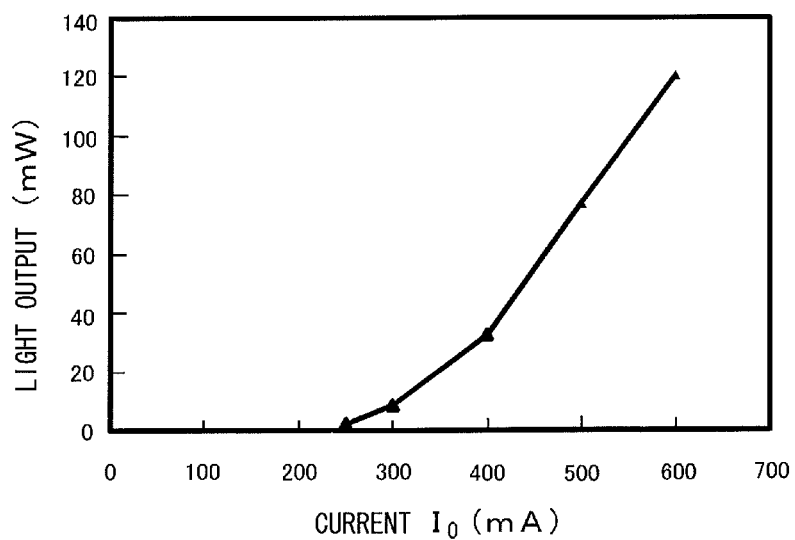

FIGS. 18A and 18B illustrate basic characteristics of the semiconductor optical amplifier 200. In FIGS. 18A and 18B, a light output (indicated by a curve "B" in FIG. 18A) when a current $I_O$ is passed from the second electrode 262 to the first electrode 261 is illustrated, and in FIG. 18A, a voltage $V_O$ (indicated by a curve "A" in FIG. 18A) applied between the second electrode 262 and the first electrode 261 when the current $I_O$ is passed from the second electrode 262 to the first electrode 261 is further illustrated. It is to be noted that a horizontal axis indicates the value (unit: milliampare) of the current $I_O$ passed from the second electrode 262 to the first electrode 261, and a vertical axis indicates a voltage V (unit: volt) applied between the second electrode 262 and the first electrode 261, and a light output (unit: milliwatt). Moreover, FIG. 18A is a graph in a state where laser light does not enter the semiconductor optical amplifier 200 from the laser light source, and FIG. 18B is a graph in a state where laser light (a light output of 2 milliwatts) enters the semiconductor optical amplifier 200 from the laser light source. It is clear from FIGS. 18A and 18B that, in the case where laser light does not enter the semiconductor optical amplifier 200 from the laser light source while the current $I_O$ of 300 milliampares is passed from the second electrode 262 to the first electrode 261, the light output from the semiconductor optical amplifier 200 is 2.6 millwatts, but in the case where laser light enters the semiconductor optical amplifier 200 from the laser light source, the light output from the semiconductor optical amplifier 200 is 8.5 milliwatts, and incident laser light to the semiconductor optical amplifier 200 is amplified by approximately 3 times by the semiconductor optical amplifier 200. It is to be noted that in the semiconductor optical amplifier 200, laser oscillation is not performed. Moreover, it is clear from FIG. 18B that, when the current $I_O$ passed from the second electrode 262 to the first electrode 261 is increased, the incident laser light to the semiconductor optical amplifier 200 is dramatically amplified by the semiconductor optical amplifier 200.

Figure 19A:
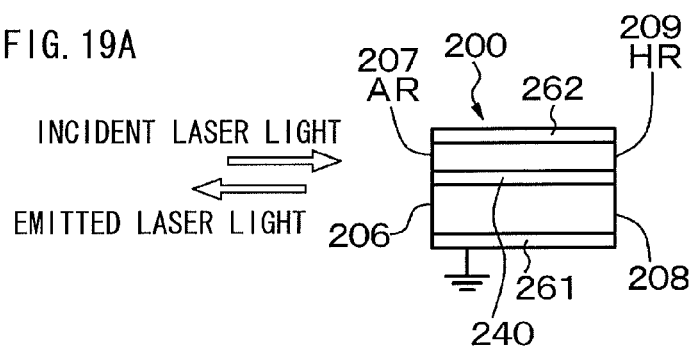
FIGS. 19A, 19B, and 19C are conceptual diagrams of a reflective semiconductor optical amplifier, a resonant semiconductor optical amplifier, and a monolithic semiconductor optical amplifier, respectively.
Figure 19B:
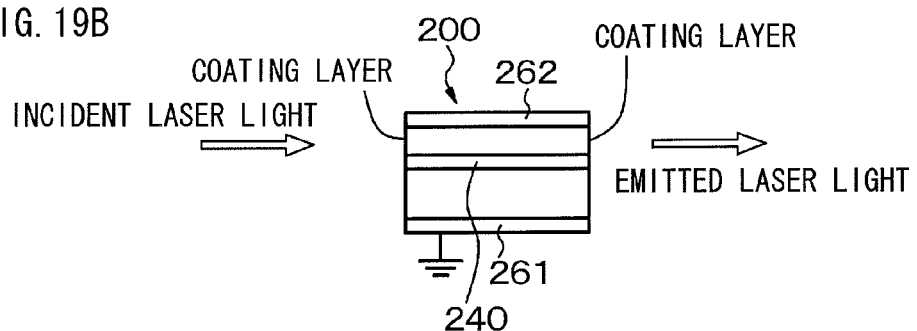
Figure 19C:
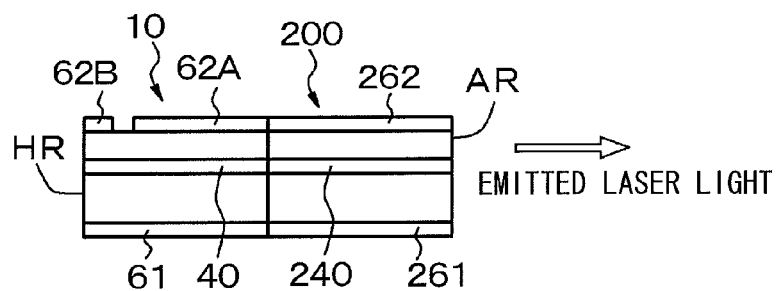

In Example 2, the semiconductor optical amplifier is configured of a transmissive semiconductor optical amplifier, but is not limited thereto, and as illustrated in conceptual diagrams in FIGS. 19A, 19B, and 19C, the semiconductor optical amplifier may be configured of a reflective semiconductor optical amplifier, a resonant semiconductor optical amplifier, or a monolithic semiconductor optical amplifier. In the reflective semiconductor optical amplifier, as illustrated in FIG. 19A, a low-reflective coating layer (AR) 207 is formed on one end surface (light-incident/emission end surface) 206 of the semiconductor optical amplifier 200, and a high-reflective coating layer (HR) 209 is formed on the other end surface 208 facing the one end surface 206. Then, laser light incident from the one end surface 206 is optically amplified in the semiconductor optical amplifier 200, and is reflected by the end surface 208 on an opposite side to pass through the semiconductor optical amplifier 200 again, thereby being optically amplified to exit from the one end surface 206. The laser light emitted from the semiconductor optical amplifier 200 is separated from laser light entering the semiconductor optical amplifier 200 by an appropriate optical component (for example, a beam splitter or a half mirror). In the case where the reflective semiconductor optical amplifier and the transmissive semiconductor optical amplifier have the same device length, the amplification path of the reflective semiconductor optical amplifier is two times as long as that of the transmissive semiconductor optical amplifier, and the reflective semiconductor optical amplifier is allowed to amplify laser light to a higher level; however, an optical component separating input laser light and output laser light is necessary. In the resonant semiconductor optical amplifier, as illustrated in FIG. 19B, coatings with moderate reflectivity are provided on both end surfaces, and laser light is resonated and amplified in the resonant semiconductor optical amplifier. When the reflectivity of the coatings is too high, laser oscillation is caused; therefore, to allow the coatings to function as an optical amplifier, it is necessary to adjust the reflectivity of the coatings. As illustrated in FIG. 19C, the monolithic semiconductor optical amplifier is a combination of a laser diode element and a semiconductor optical amplifier.

Example 3

Figure 20:
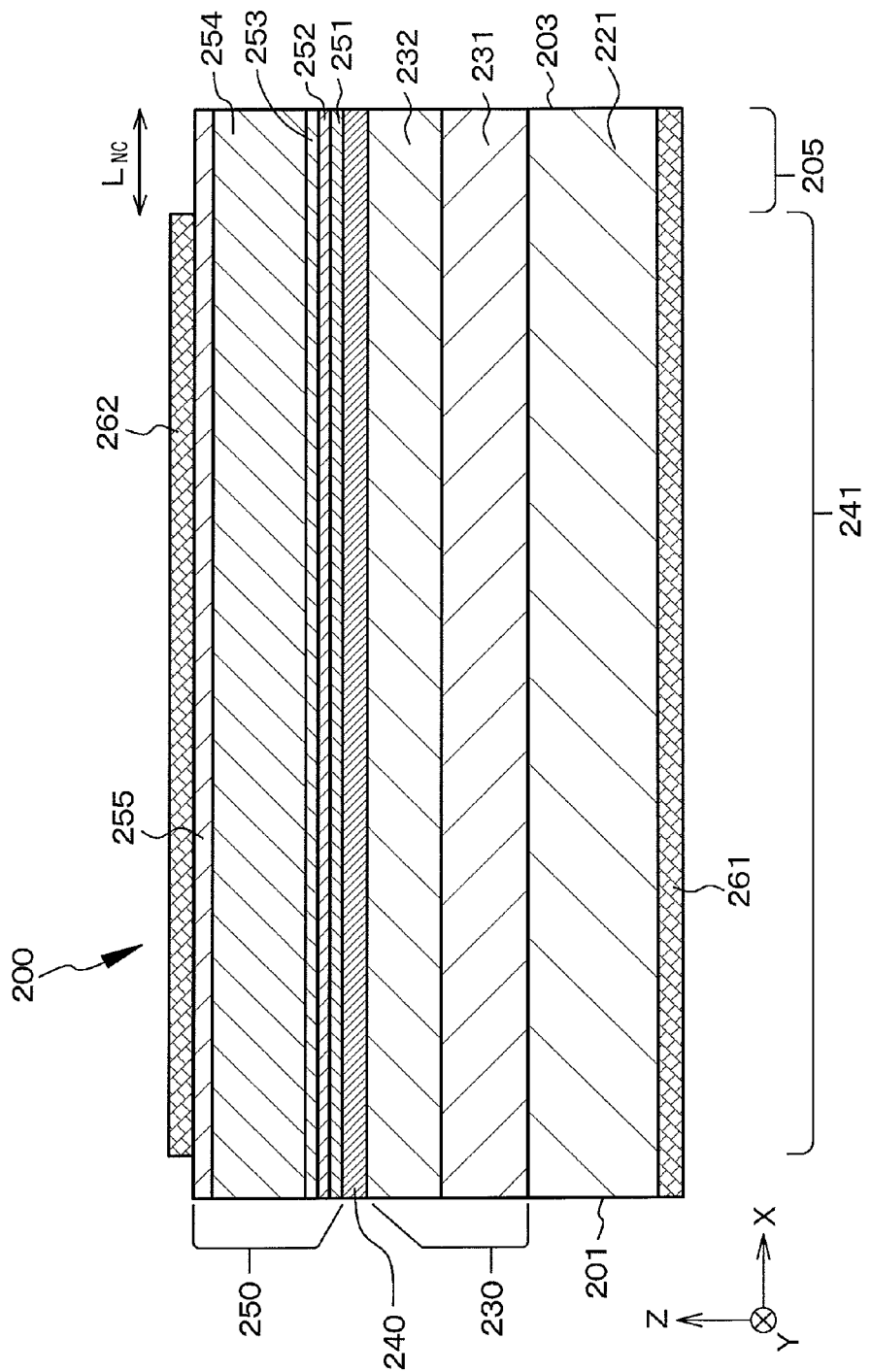
FIG. 20 is a schematic sectional view of a semiconductor optical amplifier of Example 3 taken along a virtual vertical plane including an axis line of the semiconductor optical amplifier.

Example 3 is a modification of Example 2. FIG. 20 illustrates a schematic sectional view of a semiconductor optical amplifier of Example 3 taken along a virtual vertical plane including an axis line (a direction where a waveguide extends) of the semiconductor optical amplifier.

In Example 3, a carrier non-injection region 205 is provided in a region from the light-emission end surface 203 to the inside of a laminate structure body along the axis line of the semiconductor optical amplifier 200. In this case, $L_{NC}=5$ μm is established, where the length of the carrier non-injection region 205 (the width of the carrier non-injection region 205) along the axis line of the semiconductor optical amplifier 200 is $L_{NC}$. The carrier non-injection region 205 is not provided with the second electrode 262. The length of the entire semiconductor optical amplifier is 2.0 mm. It is to be noted that the carrier non-injection region is provided also in a region from the light-incident end surface 201 to the inside of the laminate structure body along the axis line of the semiconductor optical amplifier 200.

The carrier non-injection region 205 is provided in the region from the light-emission end surface 203 to the inside of the laminate structure body along the axis line of the semiconductor optical amplifier 200 in such a manner. Thus, the width of laser light emitted from the light-emission end surface 203 is allowed to be expanded; therefore, a higher light output is achievable, and an improvement in reliability is achievable.

Figure 21:
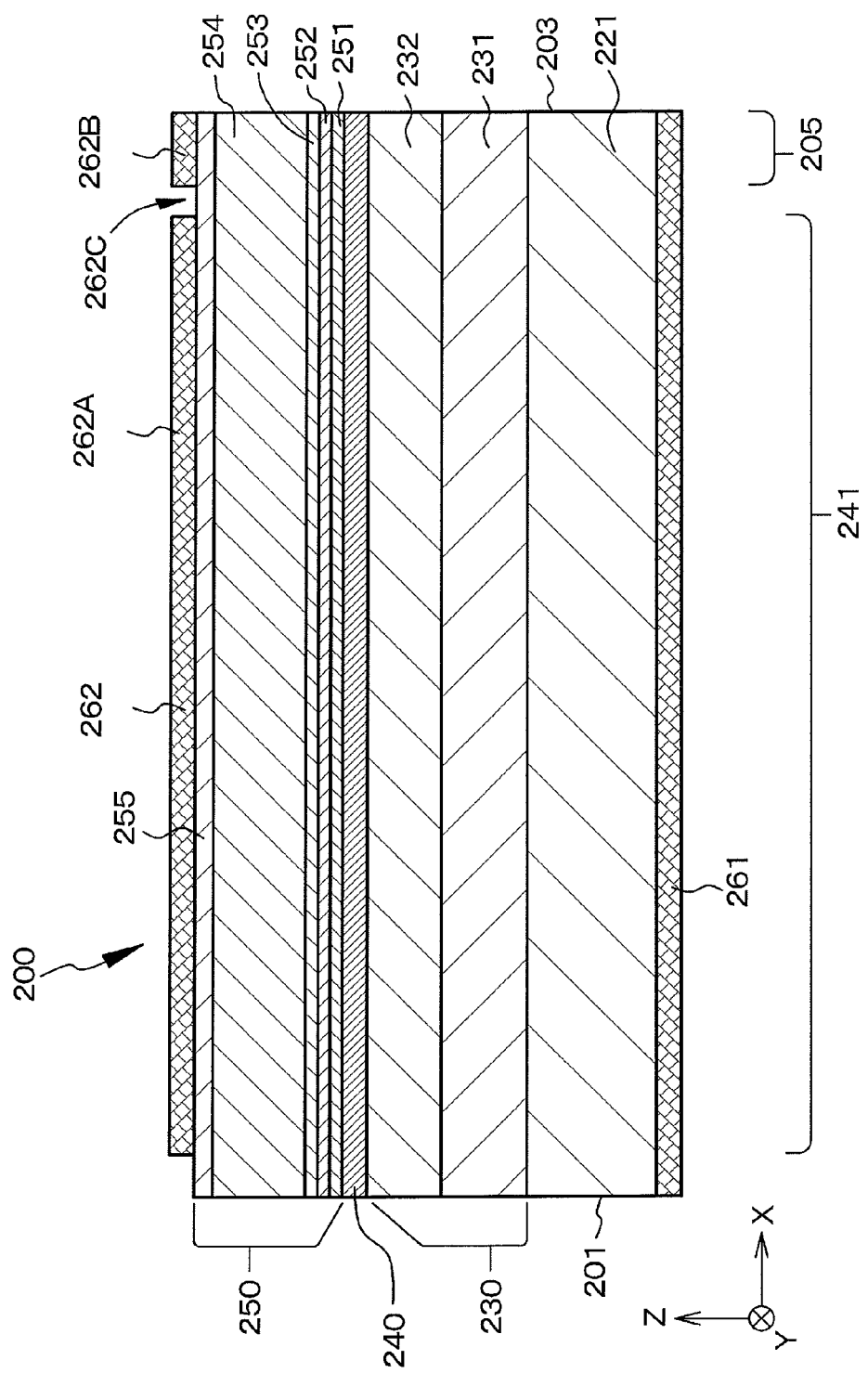
FIG. 21 is a schematic sectional view of a modification of the semiconductor optical amplifier of Example 3 taken along a virtual vertical plane including the axis line of the semiconductor optical amplifier.

Alternatively, as illustrated in FIG. 21 which is a schematic sectional view of the semiconductor optical amplifier taken along a virtual vertical plane including the axis line (an X direction) of the semiconductor optical amplifier, the second electrode 262 is configured of a first section 262A and a second section 262B separated by a separation groove 262C, and the carrier non-injection region 205 is provided with the second section 262B of the second electrode. Thus, a voltage lower than a built-in voltage, specifically 0 volts is applied to the second section 262B of the second electrode. When a voltage lower than a voltage applied to the first section is applied to the second section of the second electrode, even if the optical intensity of incident laser light is increased, a phenomenon that a relative refractive index of a compound semiconductor layer increases is allowed to be suppressed by the presence of the carrier non-injection region including the second section, and laser light emitted from the light-emission end surface of the semiconductor optical amplifier is easily expanded in a width direction. Moreover, as an area occupied by the light-emission end surface in a region where laser light is emitted from the semiconductor optical amplifier is large, a higher output of the semiconductor optical amplifier is achievable.

Example 4

Figure 22:
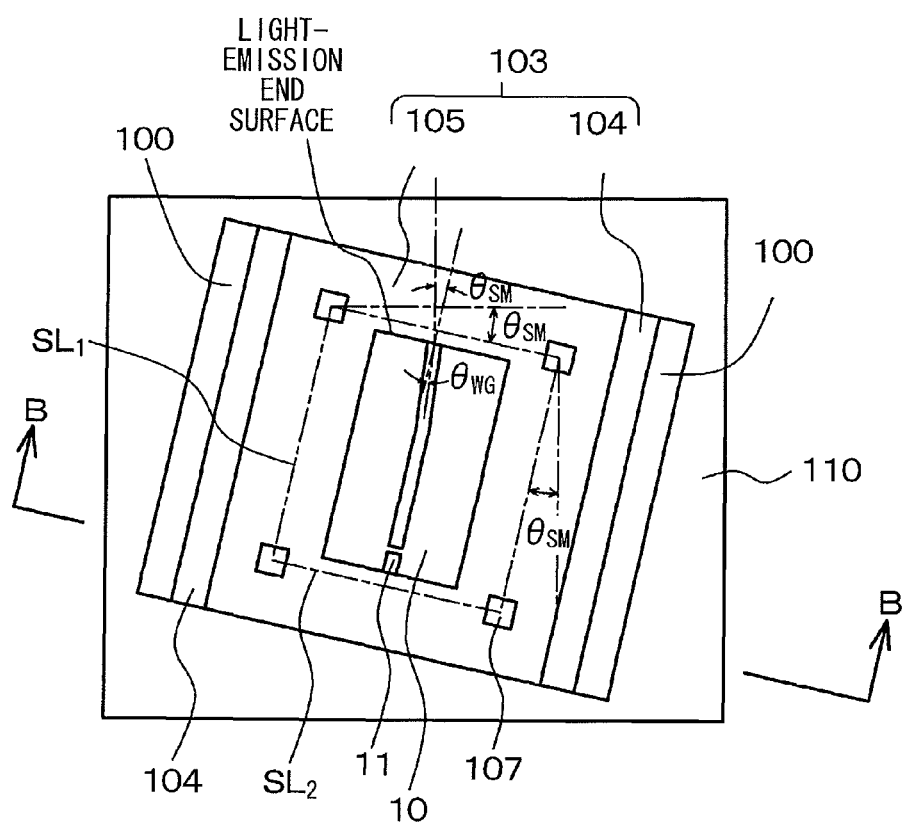
FIG. 22 is a schematic plan view of a submount assembly of Example 4.

Example 4 relates to the submount according to the embodiment of the technology, the submount assembly according to the second embodiment of the technology, and the submount assembling method according to the second embodiment of the technology. FIG. 22 illustrates a schematic plan view of a submount assembly of Example 4. It is to be noted that a schematic end surface taken along an arrow B-B of FIG. 22 is substantially the same as that in FIG. 1B. The submount assembly of Example 4 is a submount assembly including: the submount 100 allowing a semiconductor light-emitting element (for example, the laser diode element 10 described in Example 1 or the semiconductor optical amplifier 200 described in Examples 2 and 3) including the waveguide 11 to be fixed thereon, the waveguide 11 having an axis line inclined at $\theta_{WG}$ (degrees) with respect to a normal to a light-incident/emission end surface thereof and made of a semiconductor material with a refractive index $n_{LE}$; and a heat sink 110 for mounting the submount 100 thereon. Moreover, the first surface 101 where the semiconductor light-emitting element is mounted of the submount 100 is provided with the fusion-bonding material layer 103 for fixing the semiconductor light-emitting element, and the adhesive layer 108 is formed on the second surface 102 facing the first surface 101 of the submount 100, and the submount 100 is mounted on the heat sink 110 with the adhesive layer 108 in between, and the alignment mark 107 allowed to be recognized at an angle $\theta_{SM}=\sin^{-1}[n_{LE}\cdot\sin(\theta_{WG})/n_0]$ is formed on the fusion-bonding material layer 103, where a refractive index of a light-transmitting medium in proximity to the outside of the light-incident/emission end surface of the semiconductor light-emitting element is $n_0$.

It is to be noted that, as in the case of Example 1, in Example 4, the adhesive layer 108 is formed on the second surface 102 facing the first surface 101, and the submount 100 is mounted on the heat sink 110 with the adhesive layer 108 in between, and when the submount 100 is mounted on the heat sink 110, the axis line of the submount 100 and the axis line of the heat sink 110 intersect with each other at $\theta_{SM}$ (degrees). Moreover, as in the case described in Example 1 referring to FIGS. 1 to 9, the fusion-bonding material layer 103 may be provided with two or more point-like alignment marks 107, and a straight line connecting two of the alignment marks 107 may intersect with the axis line of the submount 100 at $\theta_{SM}$ (degrees) or (90-$\theta_{SM}$) (degrees), or the fusion-bonding material layer 103 may be provided with one or more strip-like alignment marks 107, and axis line of the alignment mark 107 may intersect with the axis line of the submount 100 at $\theta_{SM}$ (degrees) or (90-$\theta_{SM}$) (degrees).

In the method of assembling the submount assembly in Example 4, in a step similar to [Step-150] in Example 1, the submount 100 and the heat sink 110 are aligned with respect to the alignment marks 107, and then the adhesive layer 108 is fused and cooled to mount the submount 100 on the heat sink 110. More specifically, the alignment marks 107 are detected by an image recognition apparatus, and the straight line $SL_1$ and the straight line $SL_2$ connecting respective alignment marks 107 are determined. Then, a robot arm grasping the submount 100 is moved and rotated to allow two facing sides and other two facing sides of the heat sink 110 to intersect with the straight line $SL_1$ and the straight line $SL_2$ at $\theta_{SM}$ (degrees) and (90-$\theta_{SM}$) (degrees), respectively, and further to allow a center of the submount 100 to be positioned at a center of the heat sink 110, and then the robot arm is moved down to place the submount 100 on the heat sink 110. More specifically, the adhesive layer 108 and the heat sink 110 are brought into contact with each other. Then, the adhesive layer 108 is heated and fused by a heater, and after that, the heater is stopped to cool down the adhesive layer 108, thereby mounting the submount 100 on the heat sink 110.

After that, the submount 100 and the laser diode element 10 are aligned to allow respective sides of the submount 100 and corresponding sides of the laser diode element 10 to be parallel to each other, and the fusion-bonding material layer 103 is heated and fused by a heater, and after that, the heater is stopped to cool down the fusion-bonding material layer 103, thereby mounting the laser diode element 10 on the submount 100. Moreover, packaging is performed to obtain the submount assembly.

It is to be noted that mounting of the submount 100 onto the heat sink 110 and mounting of the laser diode element 10 onto the submount 100 may be performed concurrently, or mounting of the submount 100 onto the heat sink 110 may be performed after mounting of the laser diode element 10 onto the submount 100.

Although the present technology is described referring to preferred examples, the technology is not limited thereto. Configurations and structures of the semiconductor light-emitting element, the laser diode element, the semiconductor optical amplifier, the light output device, and the laser light source described in the preferred examples are examples, and may be modified as appropriate. Moreover, in the examples, various values are indicated, but the values are also examples; therefore, for example, when the specifications of the semiconductor light-emitting element, the laser diode element, the semiconductor optical amplifier, the light output device, the laser light source which are to be used are changed, the values are also changed. In the examples, the pulse laser diode element is described as an example of the laser diode element; however, the laser diode element may be a continuous-wave laser diode element.

In Example 1, the submount assembly is assembled while the first electrode and the submount are in contact with each other; however, alternatively, the submount assembly may be assembled while the second electrode and the submount are in contact with each other. In other words, the semiconductor light-emitting element may be mounted in a so-called junction-down manner. However, in this case, the light-incident/emission end surface of the semiconductor light-emitting element is preferably projected from the submount to prevent obstruction of progress of laser light by the substrate and the submount. In such a configuration, an effect of cooling the semiconductor light-emitting element by the heat sink is allowed to be further improved.

Moreover, the second electrode may have a laminate structure including a lower metal layer made of palladium (Pd) with a thickness of 20 nm and an upper metal layer made of nickel (Ni) with a thickness of 200 nm. It is to be noted that in wet-etching with use of aqua regia, the etching rate of nickel is approximately 1.25 times as high as that of palladium.

In the examples, the semiconductor light-emitting element is disposed on a C plane, i.e., a {0001} plane which is a polar plane of the n-type GaN substrate. In such a case, it may be difficult to electrically control saturable absorption by the QCSE effect (quantum confined Stark effect) by an internal electrical field caused by piezopolarization and spontaneous polarization in the third compound semiconductor layer. In other words, in some cases, to obtain a self-pulsation operation and a mode-locking operation, it is necessary to increase the value of a DC current passed to the first electrode or the value of a reverse bias voltage applied to the saturable absorption region, or a sub-pulse component associated with a main pulse is generated, or it is difficult to synthesize an external signal and an optical pulse. To suppress such phenomena, the semiconductor light-emitting element may be disposed on a nonpolar plane such as an A plane, i.e., a {11-20} plane, an M plane, i.e., {1-100} plane, or a {1-102} plane, or a semipolar plane such as a {11-2n} plane including a {11-24} plane or {11-22} plane, a {10-11} plane, or a {10-12} plane. Thus, even if piezopolarization and spontaneous polarization is generated in third compound semiconductor layer of the semiconductor light-emitting element, piezopolarization is not generated in the thickness direction of the third compound semiconductor layer, and piezopolariztaion is generated in a direction substantially perpendicular to the thickness direction of the third compound semiconductor layer; therefore, an adverse effect cased by piezopolarization and spontaneous polarization is allowed to be eliminated. It is to be noted that the {11-2n} plane means a nonpolar plane forming substantially 40° with respect to the C plane. Moreover, in the case where the semiconductor light-emitting element is disposed on the nonpolar plane or the semiconductor plane, the limit (within a range of 1 nm to 10 nm both inclusive) of the thickness of the well layer and the limit (within a range of $2 \times 10^{18}$ cm$^{-3}$ to $1 \times 10^{20}$ cm$^{-3}$ both inclusive) of the doping concentration of the impurity in the barrier layer are allowed to be eliminated.

Figure 23:
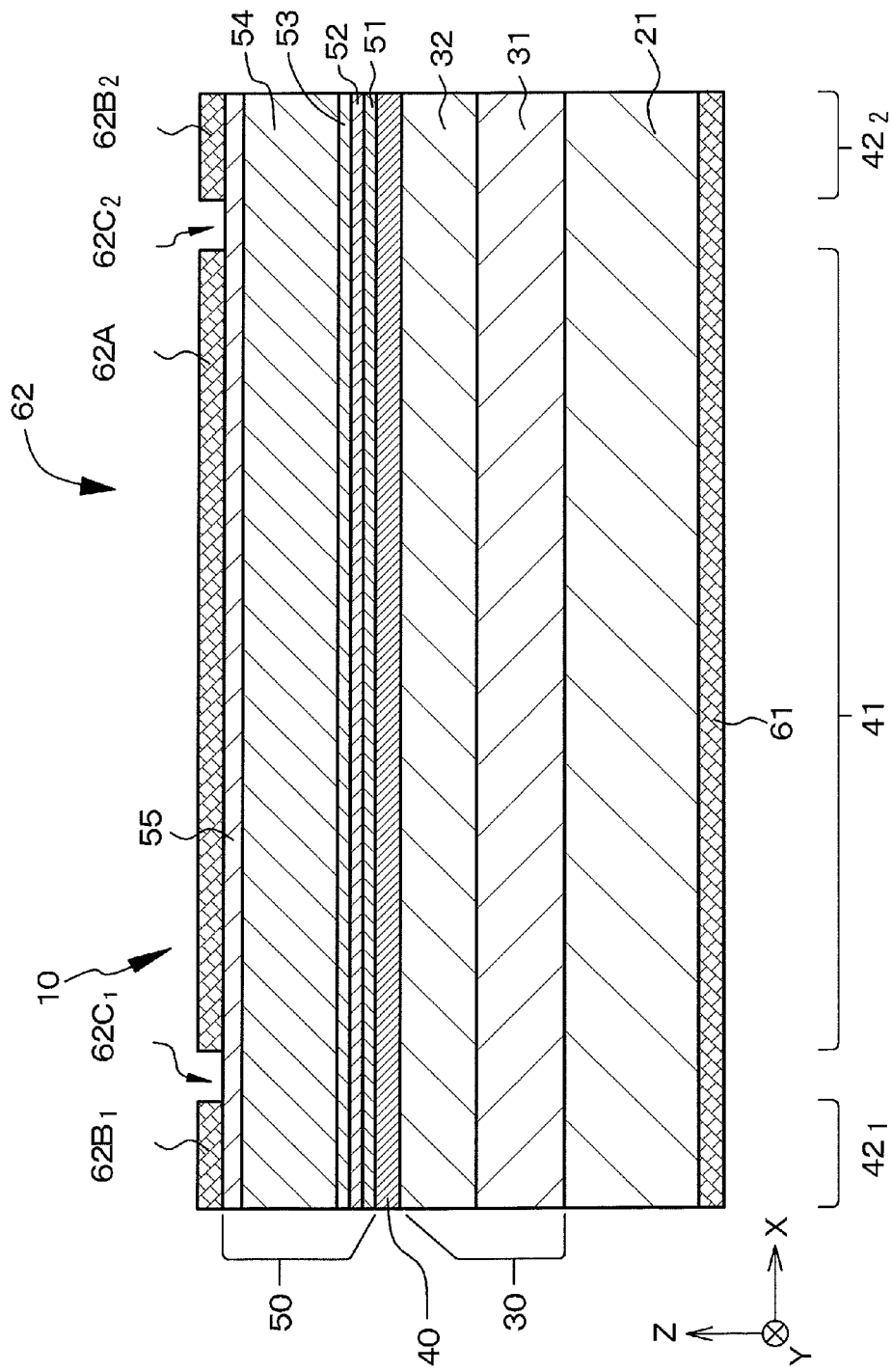
FIG. 23 is a schematic end view of a modification of the laser diode element in Example 1 taken along a virtual vertical plane including an axis line of a waveguide of the modification of the laser diode element.
Figure 24:
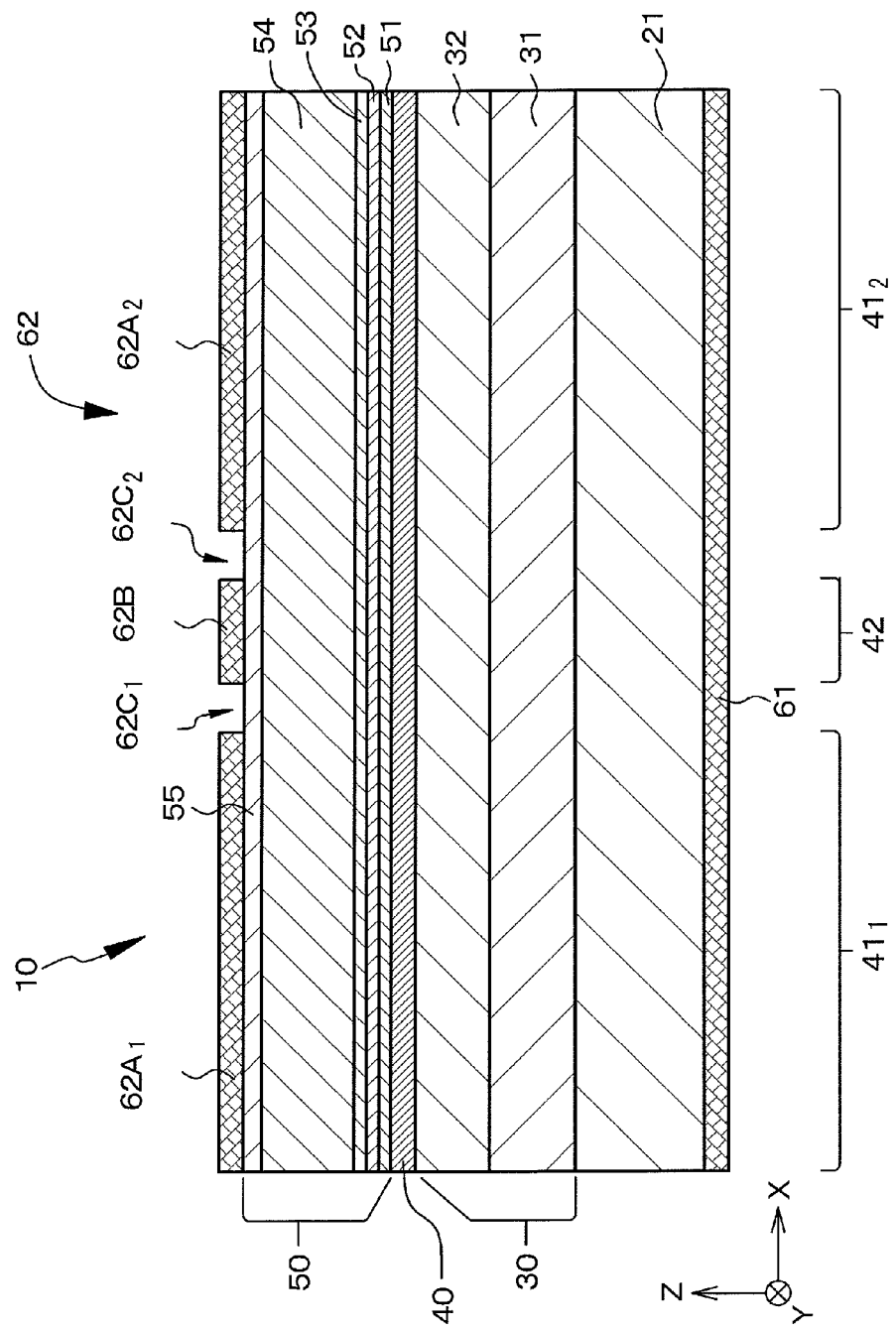
FIG. 24 is a schematic end view of another modification of the laser diode element in Example 1 taken along a virtual vertical plane including an axis line of a waveguide of the modification of the laser diode element.

The number of the light emission regions 41 or the saturable absorption regions 42 is not limited to one. FIG. 23 illustrates a schematic end view of a laser diode element including one first section 62A of the second electrode and two second sections 62B$_1$ and 62B$_2$ of the second electrode. In the laser diode element, one end of the first section 62A faces one second section 62B$_1$ with one separation groove 62C$_1$ in between, and the other end of the first section 62A faces the other second section 62B$_2$ with the other separation groove 62C$_2$ in between. Thus, one light emission region 41 is sandwiched between two saturable absorption regions 42$_1$ and 42$_2$. Alternatively, FIG. 24 illustrates a schematic end view of a mode-locked laser diode element including two first sections 62A$_1$ and 62A$_2$ of the second electrode and one second section 62B of the second electrode. In the mode-locked laser diode element, an end of the second section 62B faces one first section 62A$_1$ with one separation groove 62C$_1$ in between, and the other end of the second section 62B faces the other first section 62A$_2$ with the other separation groove 62C$_2$ in between. Thus, one saturable absorption region 42 is sandwiched between two light emission regions 41$_1$ and 41$_2$.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A light-emitting device comprising:
    a base;
    a fusion-bonding material layer formed on a first surface of the base; and
    a semiconductor light-emitting element including a waveguide fixed on the first surface, an axis line of the waveguide is inclined at and angle of $\theta_{WG}$, and made of a semiconductor material with a refractive index $n_{LE}$,
    wherein at least one alignment mark is formed in the fusion-bonding material layer, the alignment mark having an axis line of the alignment mark that is an extension direction of the alignment mark or a straight line connecting two of the alignment marks, the axis line of the alignment mark being aligned at an angle relative to an axis line of the base, wherein the alignment mark is aligned at an angle $\theta_{SM}=\sin^{-1}[n_{LE} \cdot \sin(\theta_{WG})/n_o]$, where a refractive index of a light-transmitting medium in proximity to the outside of the light-incident/emission end surface of the semiconductor light-emitting element is $n_o$, $\theta_{WG}$ is an inclination angle of an axis line of the waveguide, and $n_{LE}$ is a refractive index of the semiconductor material of the waveguide, wherein the fusion-bonding material layer has a laminate structure including a first fusion-bonding material layer and a second fusion bonding material layer formed in order from the first surface side, and wherein the alignment mark is configured from an opening formed in the first fusion-bonding material layer that exposes a portion of the second fusion-bonding material layer underneath.

2. The light-emitting device according to claim 1, wherein the axis line of the alignment mark and an axis line of the semiconductor light-emitting element are parallel with each other.

3. The light-emitting device according to claim 2, wherein the at least one alignment mark of the fusion-bonding material layer includes two or more point-like alignment marks, and a straight line that is the axis line connecting two of the alignment marks intersects with an axis line of the base at $\theta_{SM}$ (degrees) or ($90-\theta_{SM}$) (degrees).

4. The light-emitting device according to claim 2, wherein the fusion-bonding material layer is provided with one or more strip-like alignment marks, and an axis line of the alignment mark intersects with the axis line of the base at $\theta_{SM}$ (degrees) or ($90-\theta_{SM}$) (degrees).

5. The light-emitting device according to claim 2, wherein the alignment mark is allowed to overlap the semiconductor light-emitting element.

6. The light-emitting device according to claim 2, wherein the alignment mark does not overlap the semiconductor light-emitting element.

7. The light-emitting device according to claim 1, wherein the fusion-bonding material layer has a laminate structure including an Au layer and an Au—Sn alloy layer in order from the first surface side, the alignment mark is configured of an opening formed in the Au—Sn alloy layer, and the Au layer is exposed at a bottom of the opening.

8. The light-emitting device according to claim 7, wherein a projection image of the Au—Sn alloy layer is included in a projection image of the Au layer.

9. The light-emitting device according to claim 1, further comprising:

a heat sink mounted to the base.

10. The light-emitting device according to claim 1, wherein the semiconductor light-emitting element is configured of a laser diode element.

11. The light-emitting device according to claim 1, wherein $0.1 \leq \theta_{WG} \leq 10$.

12. The light-emitting device according to claim 1, wherein wherein $2 \leq \theta_{WG} \leq 6$.

* * * * *